United States Patent
Ito

(10) Patent No.: US 8,125,432 B2
(45) Date of Patent: Feb. 28, 2012

(54) COMMON VOLTAGE GENERATION CIRCUIT EMPLOYING A CHARGE-PUMP OPERATION TO GENERATE LOW-POTENTIAL-SIDE VOLTAGE

(75) Inventor: Satoru Ito, Suwa (JP)

(73) Assignee: Seiko Epson Corporation (JP)

( * ) Notice: Subject to any disclaimer, the term of this patent is extended or adjusted under 35 U.S.C. 154(b) by 786 days.

(21) Appl. No.: 12/195,802

(22) Filed: Aug. 21, 2008

(65) Prior Publication Data

US 2008/0309655 A1    Dec. 18, 2008

Related U.S. Application Data

(62) Division of application No. 11/060,623, filed on Feb. 17, 2005, now abandoned.

(30) Foreign Application Priority Data

Mar. 4, 2004    (JP) .................. 2004-060793

(51) Int. Cl.
*G09G 3/36*    (2006.01)
(52) U.S. Cl. .................. 345/95; 345/100
(58) Field of Classification Search .......... 345/36, 345/45, 76–81, 87, 94, 98, 89, 211, 95, 100; 313/484–487, 498–502; 315/169.1–169.4
See application file for complete search history.

(56) References Cited

U.S. PATENT DOCUMENTS

| | | | |
|---|---|---|---|
| 6,316,999 B1 * | 11/2001 | Kato | 330/255 |
| 6,762,565 B2 * | 7/2004 | Kudo et al. | 315/169.2 |
| 2002/0105510 A1 * | 8/2002 | Tsuchiya | 345/211 |
| 2004/0056832 A1 * | 3/2004 | Abe | 345/90 |

FOREIGN PATENT DOCUMENTS

JP    2002-366114    12/2002

* cited by examiner

*Primary Examiner* — Chanh Nguyen
*Assistant Examiner* — Ram Mistry
(74) *Attorney, Agent, or Firm* — Harness, Dickey & Pierce, P.L.C.

(57) ABSTRACT

A common voltage generation circuit includes a first operational amplifier which outputs an amplitude voltage of a common voltage based on a first power supply voltage, a second operational amplifier which outputs a high-potential-side voltage of the common voltage based on the first power supply voltage, and a low-potential-side voltage generation circuit which generates a low-potential-side voltage of the common voltage which is lower in potential than the high-potential-side voltage for the amplitude voltage by a charge-pump operation. The common voltage generation circuit supplies the high-potential-side voltage or the low-potential-side voltage to a common electrode which faces a pixel electrode specified by a scan line and a data line of an electro-optical device through an electro-optical substance.

19 Claims, 26 Drawing Sheets

COMMON VOLTAGE GENERATION CIRCUIT EMPLOYING A CHARGE-PUMP OPERATION TO GENERATE LOW-POTENTIAL-SIDE VOLTAGE

CROSS-REFERENCE TO RELATED APPLICATIONS

This application is a divisional patent application of U.S. Ser. No. 11/060,623 filed Feb. 17, 2005, claiming priority to Japanese Patent Application No. 2004-060793, filed on Mar. 4, 2004, all of which are hereby incorporated by reference.

BACKGROUND OF THE INVENTION

The present invention relates to a common voltage generation circuit, a power supply circuit, a display driver, and a common voltage generation method.

As a liquid crystal panel (electro-optical device) used in an electronic instrument, a simple matrix type liquid crystal panel and an active matrix type liquid crystal panel using a switch element such as a thin film transistor (hereinafter abbreviated as "TFT") have been known.

The simple matrix type liquid crystal panel can easily reduce power consumption in comparison with the active matrix type liquid crystal panel. However, it is difficult to increase the number of colors and to present a video display by using the simple matrix type liquid crystal panel. The active matrix type liquid crystal panel is suitable for an increase the number of colors and a video display. However, it is difficult to reduce power consumption using the active matrix type liquid crystal panel.

In recent years, a demand for an increase in the number of colors and a video display has been increased for a portable electronic instrument such as a portable telephone in order to provide a high-quality image. Therefore, the active matrix type liquid crystal panel has been increasingly used instead of the simple matrix type liquid crystal panel.

In the active matrix type liquid crystal panel used in a portable electronic instrument, the voltage applied to a liquid crystal element sealed between a pixel electrode and a common electrode which faces the pixel electrode is reversed in scan period units in order to deal with a demand for a liquid crystal AC drive and a low power supply voltage, for example.

In the case of generating a common voltage applied to the common electrode, a high-potential-side voltage and a low-potential-side voltage of the common voltage may be generated by using operational amplifiers. However, it is necessary to provide a power supply voltage to the operational amplifiers using a dual power supply method in order to sufficiently secure the output amplitude of the operational amplifiers. Therefore, since power consumption is increased due to an increase in the power supply voltage of the operational amplifiers, it is difficult to further reduce power consumption.

BRIEF SUMMARY OF THE INVENTION

A first aspect of the present invention relates to a common voltage generation circuit for generating a common voltage applied to a common electrode which faces a pixel electrode specified by a scan line and a data line of an electro-optical device through an electro-optical substance, the common voltage generation circuit including:

a first operational amplifier which outputs an amplitude voltage of the common voltage based on a first power supply voltage;

a second operational amplifier which outputs a high-potential-side voltage of the common voltage based on the first power supply voltage; and a low-potential-side voltage generation circuit which generates a low-potential-side voltage of the common voltage by a charge-pump operation and supplies the low-potential-side voltage to a backup capacitor, to which a first voltage is supplied at one end, at the other end, the low-potential-side voltage being lower in potential than the high-potential-side voltage for the amplitude voltage, wherein the common voltage generation circuit supplies the high-potential-side voltage or the low-potential-side voltage to the common electrode.

A second aspect of the present invention relates to a common voltage generation circuit for generating a common voltage applied to a common electrode which faces a pixel electrode specified by a scan line and a data line of an electro-optical device through an electro-optical substance, the common voltage generation circuit including:

a first operational amplifier which outputs an amplitude voltage of the common voltage based on a first power supply voltage;

a second operational amplifier which outputs a high-potential-side voltage of the common voltage based on the first power supply voltage; and a low-potential-side voltage generation circuit which generates a low-potential-side voltage of the common voltage by a charge-pump operation which causes the high-potential-side voltage to be supplied to one end of a flying capacitor which stores an electric charge corresponding to a voltage difference between the first power supply voltage and the amplitude voltage, the low-potential-side voltage being lower in potential than the high-potential-side voltage for the amplitude voltage, wherein the common voltage generation circuit supplies the high-potential-side voltage or the low-potential-side voltage to the common electrode.

A third aspect of the present invention relates to a power supply circuit including one of the above common voltage generation circuits.

A fourth aspect of the present invention relates to a power supply circuit for providing a power supply to an electro-optical device including a plurality of scan lines and a plurality of data lines, the power supply circuit including:

one of the above common voltage generation circuits; and a scan voltage generation circuit which generates a scan voltage of the scan line and supplies a high-potential-side voltage and a low-potential-side voltage of the scan voltage to the common voltage generation circuit.

A fifth aspect of the present invention relates to a display driver for driving an electro-optical device including a plurality of scan lines and a plurality of data lines, the display driver including:

one of the above power supply circuits; and a scan line driver circuit which drives the scan line by using the scan voltage.

A sixth aspect of the present invention relates to a display driver for driving an electro-optical device including a plurality of scan lines and a plurality of data lines, the display driver including:

one of the above power supply circuits; and a data line driver circuit which drives the data line based on display data.

A seventh aspect of the present invention relates to a display device including one of the above common voltage generation circuits, and performing a liquid crystal display by using the common voltage generated by the common voltage generation circuit.

An eighth aspect of the present invention relates to a common voltage generation method for generating a common voltage applied to a common electrode which faces a pixel electrode specified by a scan line and a data line of an electro-optical device through an electro-optical substance, the common voltage generation method including:

outputting an amplitude voltage of the common voltage based on a first power supply voltage by using a p-channel driver transistor of a voltage-follower-connected first operational amplifier, and generating a high-potential-side voltage of the common voltage based on the first power supply voltage by using an n-channel driver transistor of a voltage-follower-connected second operational amplifier;

generating a low-potential-side voltage of the common voltage by a charge-pump operation by using a flying capacitor connected between output of the first operational amplifier and the first power supply voltage, the low-potential-side voltage being lower in potential than the high-potential-side voltage for the amplitude voltage; and supplying the high-potential-side voltage or the low-potential-side voltage to the common electrode.

DETAILED DESCRIPTION OF THE EMBODIMENT

Figure 1:
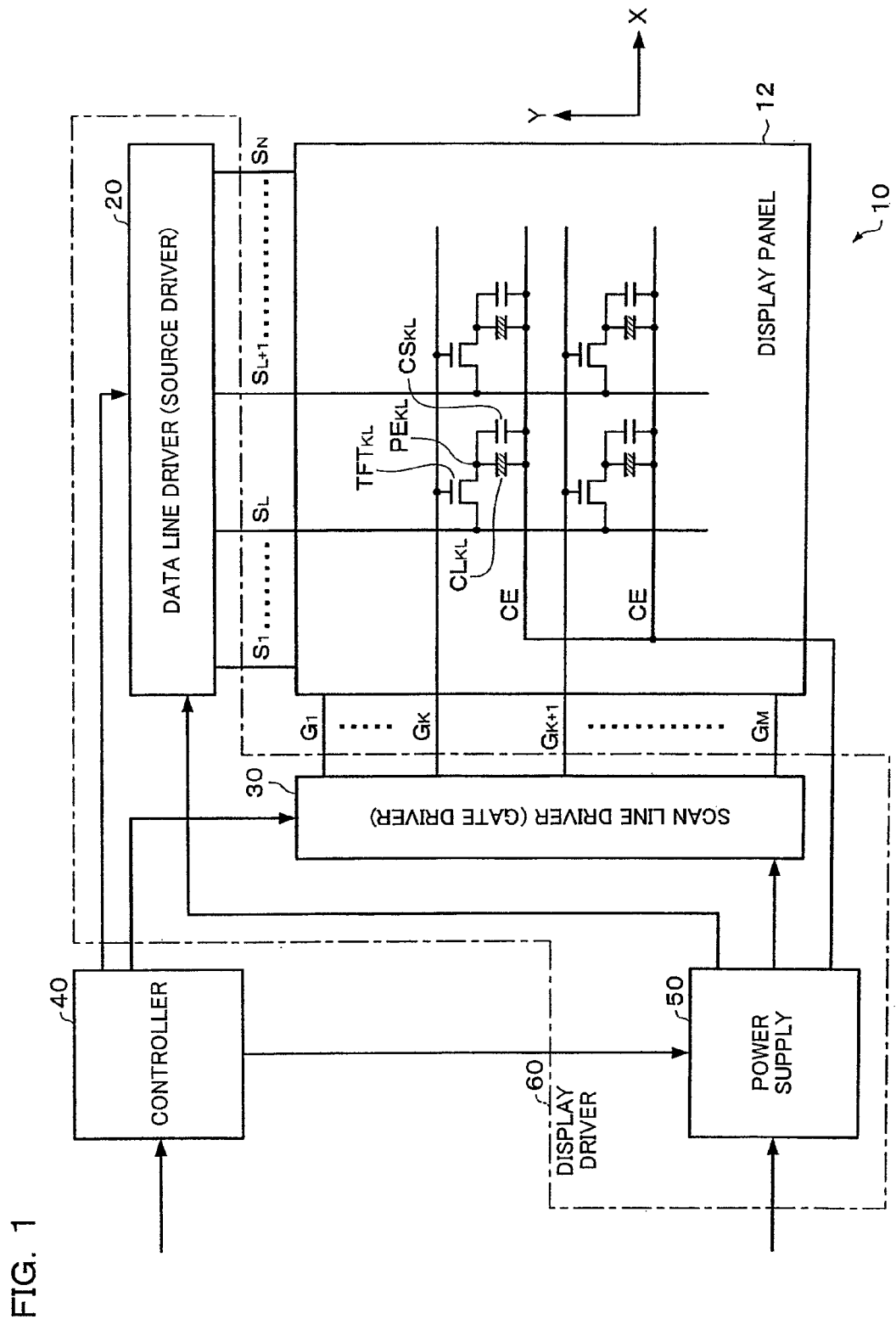
FIG. 1 is an example of a block diagram of a liquid crystal device to which a common voltage generation circuit in an embodiment of the present invention is applied.

The present invention has been achieved in view of the above-described technical problem, and may provide a common voltage generation circuit, a power supply circuit, a display driver, and a common voltage generation method which can generate a common voltage while consuming only a small amount of power.

An embodiment of the present invention provides a common voltage generation circuit for generating a common voltage applied to a common electrode which faces a pixel electrode specified by a scan line and a data line of an electro-optical device through an electro-optical substance, the common voltage generation circuit including:

a first operational amplifier which outputs an amplitude voltage of the common voltage based on a first power supply voltage;

a second operational amplifier which outputs a high-potential-side voltage of the common voltage based on the first power supply voltage; and a low-potential-side voltage generation circuit which generates a low-potential-side voltage of the common voltage by a charge-pump operation and supplies the low-potential-side voltage to a backup capacitor, to which a first voltage is supplied at one end, at the other end, the low-potential-side voltage being lower in potential than the high-potential-side voltage for the amplitude voltage, wherein the common voltage generation circuit supplies the high-potential-side voltage or the low-potential-side voltage to the common electrode.

An embodiment of the present invention provides a common voltage generation circuit for generating a common voltage applied to a common electrode which faces a pixel electrode specified by a scan line and a data line of an electro-optical device through an electro-optical substance, the common voltage generation circuit including:

a first operational amplifier which outputs an amplitude voltage of the common voltage based on a first power supply voltage;

a second operational amplifier which outputs a high-potential-side voltage of the common voltage based on the first power supply voltage; and a low-potential-side voltage generation circuit which generates a low-potential-side voltage of the common voltage by a charge-pump operation which causes the high-potential-side voltage to be supplied to one end of a flying capacitor which stores an electric charge corresponding to a voltage difference between the first power supply voltage and the amplitude voltage, the low-potential-side voltage being lower in potential than the high-potential-side voltage for the amplitude voltage, wherein the common voltage generation circuit supplies the high-potential-side voltage or the low-potential-side voltage to the common electrode.

According to these embodiments, since the low-potential-side voltage of the common voltage is generated by the charge-pump operation, the number of operational amplifiers can be reduced. Moreover, the width (the amplitude) of the power supply voltage of the operational amplifier which forms the common voltage generation circuit can be reduced in comparison with a configuration in which an operational amplifier outputs the low-potential-side voltage. Furthermore, power consumption can be significantly reduced in comparison with a configuration in which an operational amplifier outputs the low-potential-side voltage by reducing the number of paths of current consumed by the operational amplifier and reducing the width of the power supply voltage of the operational amplifier.

With any one of the above common voltage generation circuits, the low-potential-side voltage generation circuit may include:

first and second switch elements connected in series; and third and fourth switch elements connected in series, the amplitude voltage may be supplied to one end of the first switch element, the high-potential-side voltage may be supplied to one end of the second switch element, the first power supply voltage may be supplied to one end of the third switch element, the first power supply voltage may be supplied to one end of the backup capacitor, in a first period, the first switch element may be turned on and the second switch element may be turned off to supply the amplitude voltage to one end of a flying capacitor, and the third switch element may be turned on and the fourth switch element may be turned off, and in a second period subsequent to the first period, the first switch element may be turned off and the second switch element may be turned on to supply the high-potential-side voltage to one end of the flying capacitor, and the third switch element may be turned off and the fourth switch element may be turned on to supply a voltage of the other end of the flying capacitor to the other end of the backup capacitor.

According to this feature, power consumption of the common voltage generation circuit can be significantly reduced by reducing the number of paths of current consumed by the operational amplifier and reducing the width of the power supply voltage of the operational amplifier using a simple configuration of providing the first to fourth switch elements.

With any one of the above common voltage generation circuits, the first and second switch elements may be MOS transistors, amplitude of gate voltages of the MOS transistors which form the first and second switch elements being greater than a voltage difference between the amplitude voltage and the high-potential-side voltage, and the third and fourth switch elements may be MOS transistors, amplitude of gate voltages of the MOS transistors which form the third and fourth switch elements being greater than a voltage difference between the first power supply voltage and the low-potential-side voltage.

With any one of the above common voltage generation circuits, the amplitude of the gate voltages of the MOS transistors which form the first to fourth switch elements may be the same as amplitude of a scan voltage applied to the scan line.

According to this feature, since the impedance when the first to fourth switch elements of the common voltage generation circuit are turned on can be decreased, the boost efficiency can be improved by preventing loss caused by the charge-pump operation, and the above-described reduction of power consumption can be realized.

With any one of the above common voltage generation circuits, the second operational amplifier may be a voltage-follower-connected operational amplifier, output of the second operational amplifier being driven by an n-channel driver transistor, and the amplitude voltage may be a potential higher than the high-potential-side voltage.

With any one of the above common voltage generation circuits, the second operational amplifier may include a second differential section and a second driver section which are voltage-follower-connected, and the second driver section may include:

a current source which is connected with a second power supply voltage at one end and is connected with the output of the second operational amplifier at the other end; and an n-channel driver transistor which is connected with the first power supply voltage at one end and is connected with the output of the second operational amplifier at the other end.

According to this feature, since it suffices that the second operational amplifier supply current to such an extent that the output potential is not decreased, the amount of current flowing through the current source of the second operational amplifier can be reduced, whereby power consumption can be further reduced.

With any one of the above common voltage generation circuits, the first operational amplifier may be a voltage-follower-connected operational amplifier, output of the first operational amplifier being driven by a p-channel driver transistor.

With any one of the above common voltage generation circuits, the first operational amplifier may include a first differential section and a first driver section which are voltage-follower-connected, and the first driver section may include:

a p-channel driver transistor which is connected with a second power supply voltage at one end and is connected with the output of the first operational amplifier at the other end; and a current source which is connected with the first power supply voltage at one end and is connected with the output of the first operational amplifier at the other end.

According to this feature, since it is unnecessary for the first operational amplifier to decrease the output potential toward the low potential side, the amount of current flowing through the current source of the first operational amplifier can be reduced, whereby power consumption can be further reduced.

Any one of the above common voltage generation circuits may include:

a first output transistor to which the high-potential-side voltage is supplied at one end; and a second output transistor to which the low-potential-side voltage is supplied at one end, the other end of the first output transistor may be connected with the other end of the second output transistor, and amplitude of gate voltages of the first and second output transistors may be greater than a voltage difference between the high-potential-side voltage and the low-potential-side voltage.

With any one of the above common voltage generation circuits, the amplitude of the gate voltages of the first and second output transistors may be the same as amplitude of a scan voltage applied to the scan line.

According to this feature, since the output impedance of the common voltage generation circuit can be decreased, a desired high-potential-side voltage or low-potential-side voltage can be supplied to the common electrode. Therefore, even when using a charge pump output having a low drive capability in comparison with an operational amplifier, power consumption can be reduced while preventing deterioration of the image quality.

An embodiment of the present invention provides a power supply circuit including one of the above common voltage generation circuits.

An embodiment of the present invention provides a power supply circuit for providing a power supply to an electro-optical device including a plurality of scan lines and a plurality of data lines, the power supply circuit including:

one of the above common voltage generation circuits; and a scan voltage generation circuit which generates a scan voltage of the scan line and supplies a high-potential-side voltage and a low-potential-side voltage of the scan voltage to the common voltage generation circuit.

According to these embodiments, a power supply circuit which realizes a significant reduction of power consumption can be provided.

An embodiment of the present invention provides a display driver for driving an electro-optical device including a plurality of scan lines and a plurality of data lines, the display driver including:

one of the above power supply circuits; and a scan line driver circuit which drives the scan line by using the scan voltage.

This display driver may include a data line driver circuit which drives the data line based on display data.

An embodiment of the present invention provides a display driver for driving an electro-optical device including a plurality of scan lines and a plurality of data lines, the display driver including:

one of the above power supply circuits; and a data line driver circuit which drives the data line based on display data.

According to this embodiment, a display driver which realizes a significant reduction of power consumption can be provided.

An embodiment of the present invention provides a display device including one of the above common voltage generation circuits, and performing a liquid crystal display by using the common voltage generated by the common voltage generation circuit.

According to this embodiment, a display device which realizes a significant reduction of power consumption can be provided.

An embodiment of the present invention provides a common voltage generation method for generating a common voltage applied to a common electrode which faces a pixel electrode specified by a scan line and a data line of an electro-optical device through an electro-optical substance, the common voltage generation method including:

outputting an amplitude voltage of the common voltage based on a first power supply voltage by using a p-channel driver transistor of a voltage-follower-connected first operational amplifier, and generating a high-potential-side voltage of the common voltage based on the first power supply voltage by using an n-channel driver transistor of a voltage-follower-connected second operational amplifier;

generating a low-potential-side voltage of the common voltage by a charge-pump operation by using a flying capacitor connected between output of the first operational amplifier and the first power supply voltage, the low-potential-side voltage being lower in potential than the high-potential-side voltage for the amplitude voltage; and supplying the high-potential-side voltage or the low-potential-side voltage to the common electrode.

The embodiments of the present invention are described below in detail with reference to the drawings. Note that the embodiments described hereunder do not in any way limit the scope of the invention defined by the claims laid out herein. Note also that not all of the elements of these embodiments should be taken as essential requirements to the means of the present invention.

1. Liquid Crystal Device

FIG. 1 is a block diagram of a liquid crystal device to which a common voltage generation circuit in this embodiment is applied.

This liquid crystal device 10 (display device in a broad sense) includes a display panel 12 (liquid crystal display (LCD) panel in a narrow sense), a data line driver circuit 20 (source driver in a narrow sense), a scan line driver circuit 30 (gate driver in a narrow sense), a controller 40, and a power supply circuit 50. The liquid crystal device 10 does not necessarily include all of these circuit blocks. The liquid crystal device 10 may have a configuration in which some of the circuit blocks are omitted.

The display panel 12 (electro-optical device in a broad sense) includes a plurality of scan lines (gate lines in a narrow sense), a plurality of data lines (source lines in a narrow sense), and pixel electrodes specified by the scan lines and the data lines. In this case, an active matrix type liquid crystal device may be formed by connecting a thin film transistor TFT (switch element in a broad sense) with the data line and connecting the pixel electrode with the thin film transistor TFT.

In more detail, the display panel 12 is formed on an active matrix substrate (glass substrate, for example). A plurality of scan lines $G_1$ to $G_M$ (M is a natural number of two or more), arranged in a direction Y shown in FIG. 1 and extending in a direction X, and a plurality of data lines $S_1$ to $S_N$ (N is a natural number of two or more), arranged in the direction X and extending in the direction Y, are disposed on the active matrix substrate. A thin film transistor $TFT_{KL}$ (switch element in a broad sense) is formed at a position corresponding to the intersecting point of the scan line $G_K$ ($1 \leq K \leq M$, K is a natural number) and the data line $S_L$ ($1 \leq L \leq N$, L is a natural number).

A gate electrode of the thin film transistor $TFT_{KL}$ is connected with the scan line $G_K$, a source electrode of the thin film transistor $TFT_{KL}$ is connected with the data line $S_L$, and a drain electrode of the thin film transistor $TFT_{KL}$ is connected with the pixel electrode $PE_{KL}$. A liquid crystal capacitor $CL_{KL}$ (liquid crystal element) and a storage capacitor $CS_{KL}$ are formed between the pixel electrode $PE_{KL}$ and a common electrode CE which faces the pixel electrode $CL_{KL}$ through a liquid crystal (electro-optical substance in a broad sense). A liquid crystal is sealed between the active matrix substrate on which the thin film transistor $TFT_{KL}$, the pixel electrode $PE_{KL}$, and the like are formed and a common substrate on which the common electrode CE is formed, and the transmissivity of a pixel changes corresponding to the voltage applied between the pixel electrode $PE_{KL}$ and the common electrode CE.

The voltage level (high-potential-side voltage or low-potential-side voltage) of a common voltage VCOM applied to the common electrode CE is generated by a common voltage generation circuit included in the power supply circuit 50. The common electrode CE may not be formed over the common substrate, and may be formed in the shape of strips so as to correspond to the scan lines.

The data line driver circuit 20 drives the data lines $S_1$ to $S_N$ of the display panel 20 based on display data. The scan line driver circuit 30 scans (sequentially drives) the scan lines $G_1$ to $G_M$ of the display panel 12.

The controller 40 controls the data line driver circuit 20, the scan line driver circuit 30, and the power supply circuit 50 according to the content set by a host such as a central processing unit (CPU) (not shown). In more detail, the controller 40 provides an operation mode setting and a vertical synchronization signal or a horizontal synchronization signal generated therein to the data line driver circuit 20 and the scan line driver circuit 30. The controller 40 controls the power supply circuit 50 as to the polarity reversal timing of the voltage level of the common voltage VCOM applied to the common electrode CE.

The power supply circuit 50 generates various voltage levels (gray-scale voltages) necessary for driving the display panel 12 or the voltage level of the common voltage VCOM of the common electrode CE based on a reference voltage supplied from the outside.

In the liquid crystal device 10 having such a configuration, the data line driver circuit 20, the scan line driver circuit 30, and the power supply circuit 50 drive the display panel 12 in combination based on the display data supplied from the outside under control of the controller 40.

In FIG. 1, the liquid crystal device 10 includes the controller 40. However, the controller 40 may be provided outside the liquid crystal device 10. Or, the host may be included in the liquid crystal device 10 together with the controller 40. Some or all of the data line driver circuit 20, the scan line driver circuit 30, the controller 40, and the power supply circuit 50 may be formed on the display panel 12.

In FIG. 1, a display driver 60 may be formed by integrating the data line driver circuit 20, the scan line driver circuit 30, and the power supply circuit 50 as a semiconductor device (integrated circuit or IC). The display driver 60 may include the controller 40. In FIG. 1, the display driver 60 may be a semiconductor device in which one of the data line driver circuit 20 and the scan line driver circuit 30 and the power supply circuit 50 are integrated.

1.1 Data Line Driver Circuit

Figure 2:
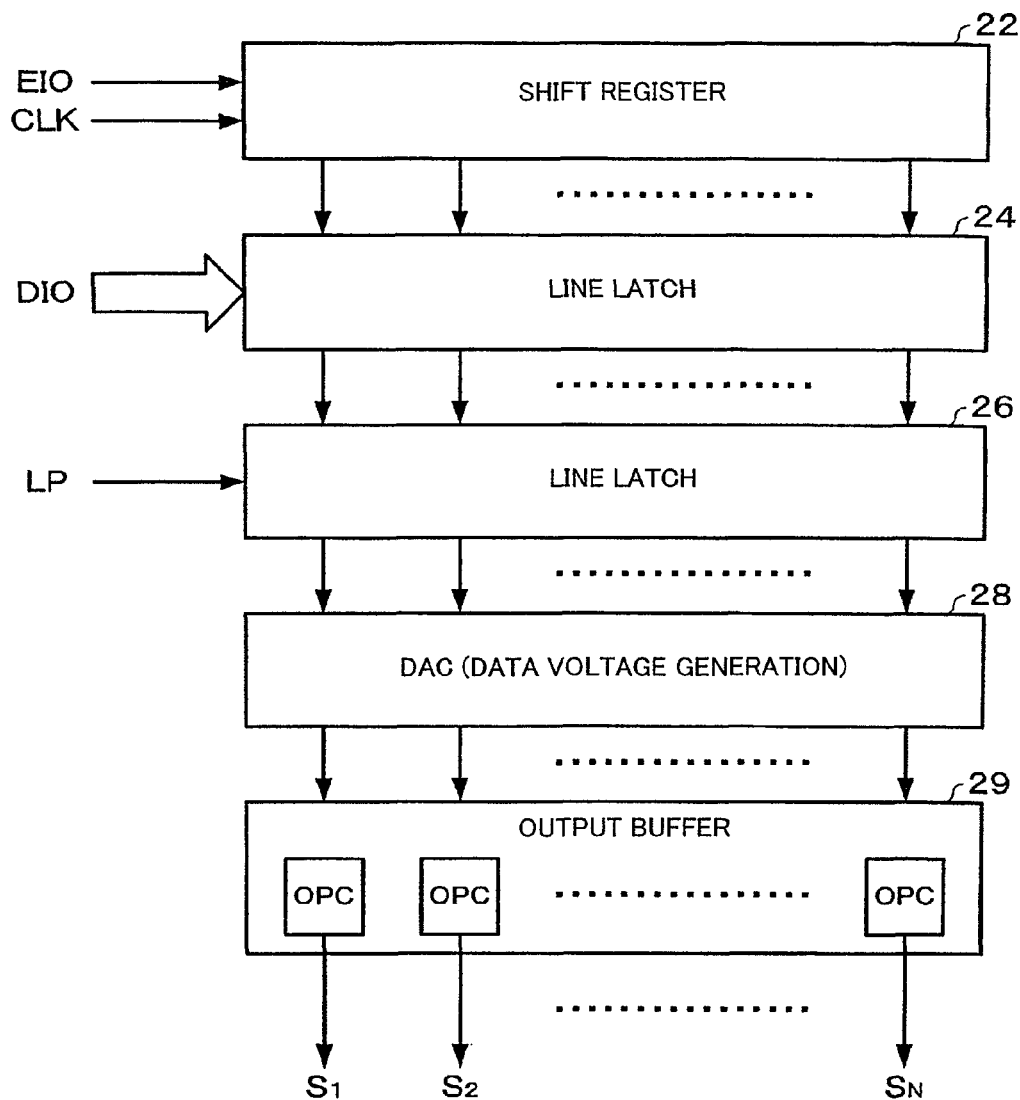
FIG. 2 is a block diagram of a configuration example of a data line driver circuit shown in FIG. 1.

FIG. 2 shows a configuration example of the data line driver circuit 20 shown in FIG. 1.

The data line driver circuit 20 includes a shift register 22, line latches 24 and 26, a digital-to-analog converter (DAC) 28 (data voltage generation circuit in a broad sense), and an output buffer 29.

The shift register 22 includes a plurality of flip-flops, each of the flip-flops being provided corresponding to the data line and sequentially connected. The shift register 22 holds an enable input-output signal EIO in synchronization with a clock signal CLK, and sequentially shifts the enable input-output signal EIO to the adjacent flip-flops in synchronization with the clock signal CLK.

Display data (DIO) is input to the line latch 24 from the controller 40 in units of 18 bits (6 bits (grayscale data)×3 (each color of RGB)), for example. The line latch 24 latches the display data (DIO) in synchronization with the enable input-output signal EIO sequentially shifted by the flip-flops of the shift register 22.

The line latch 26 latches the display data in one horizontal scan unit latched by the data latch 24 in synchronization with a horizontal synchronization signal LP supplied from the controller 40.

The DAC 28 generates an analog data voltage supplied to the data line. In more detail, the DAC 28 selects one of gray-scale voltages from the power supply circuit 50 shown in FIG. 1 based on digital display data from the line latch 26, and outputs an analog data voltage corresponding to the digital display data.

The output buffer 29 drives the data line by buffering the data voltage from the DAC 28 and outputting the data voltage to the data line. In more detail, the output buffer 29 includes voltage-follower-connected operational amplifier circuits OPC provided in data line units, and each of the operational amplifier circuits OPC converts the data voltage from the DAC 28 by impedance conversion and outputs the converted data voltage to the data line.

In FIG. 2, a configuration in which the digital display data is digital/analog converted and output to the data line through the output buffer 29 is used. However, a configuration in which an analog image signal is sampled/held and output to the data line through the output buffer 29 may also be used.

1.2 Scan Line Driver Circuit

Figure 3:
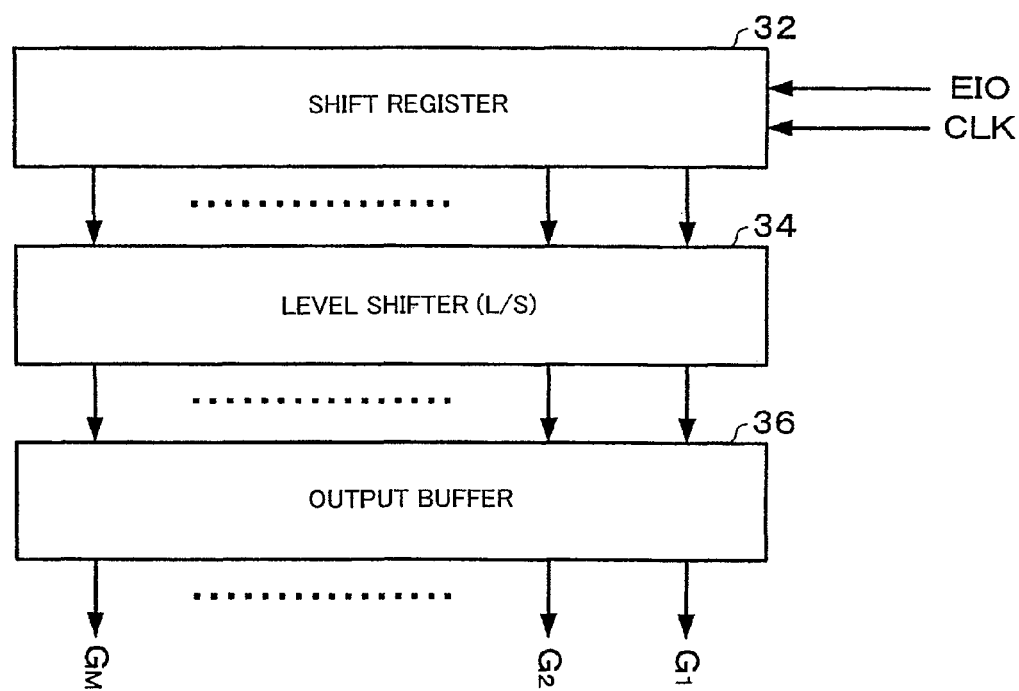
FIG. 3 is a block diagram of a configuration example of a scan line driver circuit shown in FIG. 1.

FIG. 3 shows a configuration example of the scan line driver circuit 30 shown in FIG. 1.

The scan line driver circuit 30 includes a shift register 32, a level shifter 34, and an output buffer 36.

The shift register 32 includes a plurality of flip-flops, each of the flip-flops being provided corresponding to the scan line and sequentially connected. The shift register 32 holds the enable input-output signal EIO in the flip-flop in synchronization with the clock signal CLK, and sequentially shifts the enable input-output signal EIO to the adjacent flip-flops in synchronization with the clock signal CLK. The input enable input-output signal EIO is the vertical synchronization signal supplied from the controller 40.

The level shifter 34 shifts the voltage level from the shift register 32 to a voltage level corresponding to the liquid crystal device of the display panel 12 and the transistor performance of the thin film transistor TFT. Since a high voltage level of 20 to 50 V is required as the voltage level, a high voltage process differing from that for other logic circuit sections is used.

The output buffer 36 drives the scan line by buffering the scan voltage shifted by the level shifter 34 and outputting the scan voltage to the scan line.

1.3 Power Supply Circuit

Figure 4:
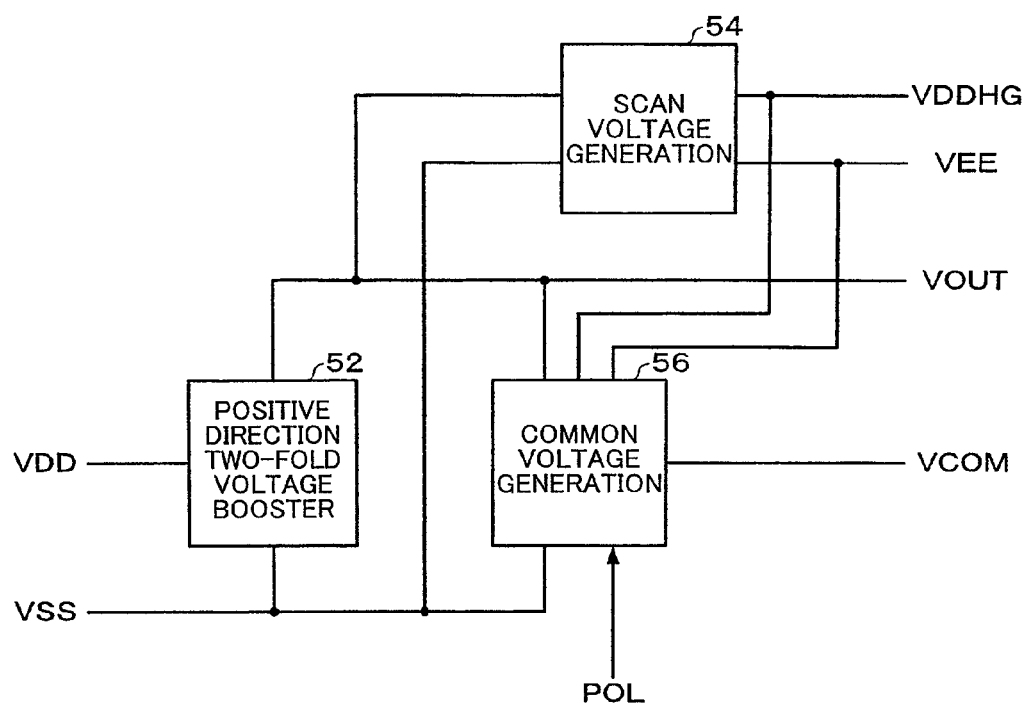
FIG. 4 is a block diagram of a configuration example of a power supply circuit shown in FIG. 1.

FIG. 4 shows a configuration example of the power supply circuit 50 shown in FIG. 1.

The power supply circuit 50 includes a positive direction two-fold voltage booster circuit 52, a scan voltage generation circuit 54, and a common voltage generation circuit 56. A system ground power supply voltage VSS (first power supply voltage) and a system power supply voltage VDD are supplied to the power supply circuit 50.

The system ground power supply voltage VSS and the system power supply voltage VDD are supplied to the positive direction two-fold voltage booster circuit 52. The positive direction two-fold voltage booster circuit 52 generates a power supply voltage VOUT (second power supply voltage) obtained by boosting the system power supply voltage VDD twice in the positive direction based on the system ground power supply voltage VSS. Specifically, the positive direction two-fold voltage booster circuit 52 boosts the voltage difference between the system ground power supply voltage VSS and the system power supply voltage VDD twice. The positive direction two-fold voltage booster circuit 52 may be formed by a conventional charge-pump circuit. The power supply voltage VOUT is supplied to the data line driver circuit 20, the scan voltage generation circuit 54, and the common voltage generation circuit 56. It is desirable that the positive direction two-fold voltage booster circuit 52 output the power supply voltage VOUT obtained by boosting the system power supply voltage VDD twice in the positive direction by boosting the system power supply voltage VDD at a boost factor of two or more and regulating the voltage level using a regulator after boosting.

The system ground power supply voltage VSS and the power supply voltage VOUT are supplied to the scan voltage generation circuit 54. The scan voltage generation circuit 54 generates the scan voltage. The scan voltage is a voltage applied to the scan line driven by the scan line driver circuit 30. The high-potential-side voltage of the scan voltage is a voltage VDDHG, and the low-potential-side voltage of the scan voltage is a voltage VEE. In this embodiment, the high-potential-side voltage VDDHG and the low-potential-side voltage VEE of the scan voltage are also supplied to the common voltage generation circuit 56.

The common voltage generation circuit 56 generates the common voltage VCOM. The common voltage generation circuit 56 outputs one of the high-potential-side voltage VCOMH and the low-potential-side voltage VCOML as the common voltage VCOM based on a polarity reversal signal POL. The polarity reversal signal POL is generated by the controller 40 corresponding to the polarity reversal timing.

Figure 5:
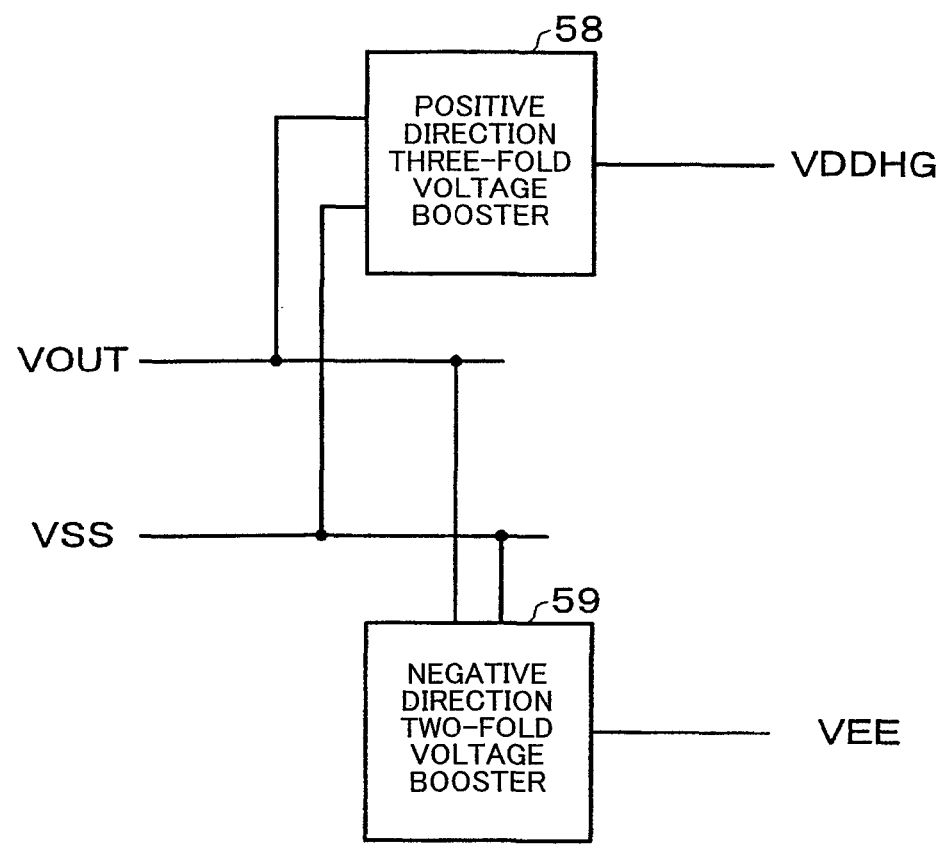
FIG. 5 is a block diagram of a configuration example of a scan voltage generation circuit shown in FIG. 4.

FIG. 5 shows a configuration example of the scan voltage generation circuit 54 shown in FIG. 4.

The scan voltage generation circuit 54 includes a positive direction three-fold voltage booster circuit 58 and a negative direction two-fold voltage booster circuit 59.

The positive direction three-fold voltage booster circuit 58 generates the high-potential-side voltage VDDHG of the scan voltage obtained by boosting the power supply voltage VOUT three times in the positive direction based on the system ground power supply voltage VSS. Specifically, the positive direction three-fold voltage booster circuit 58 boosts the voltage difference between the system ground power supply voltage VSS and the power supply voltage VOUT three times. The positive direction three-fold voltage booster circuit 58 may be formed by a conventional charge-pump circuit.

The negative direction two-fold voltage booster circuit 59 generates the high-potential-side voltage VEE of the scan voltage obtained by boosting the power supply voltage VOUT twice in the negative direction based on the system ground power supply voltage VSS. Specifically, the negative direction two-fold voltage booster circuit 59 boosts the voltage difference between the system ground power supply voltage VSS and the power supply voltage VOUT (−2) times. The negative direction two-fold voltage booster circuit 59 may be formed by a conventional charge-pump circuit.

The positive direction three-fold voltage booster circuit 58 and the negative direction two-fold voltage booster circuit 59 may boost a voltage at a predetermined boost factor or more, regulate the voltage level using a regulator, and output the regulated voltage.

In the case where the common voltage generation circuit 56 shown in FIG. 4 is formed by using a high voltage process as in the scan voltage generation circuit 54, it is preferable that the amplitude of the gate voltages of metal oxide semiconductor (MOS) transistors which form the common voltage generation circuit 56 be the amplitude between the high-potential-side voltage VDDHG and the low-potential-side voltage VEE generated by the scan voltage generation circuit 54. In this case, the impedance can be sufficiently reduced when the MOS transistors conduct electricity.

Figure 6:
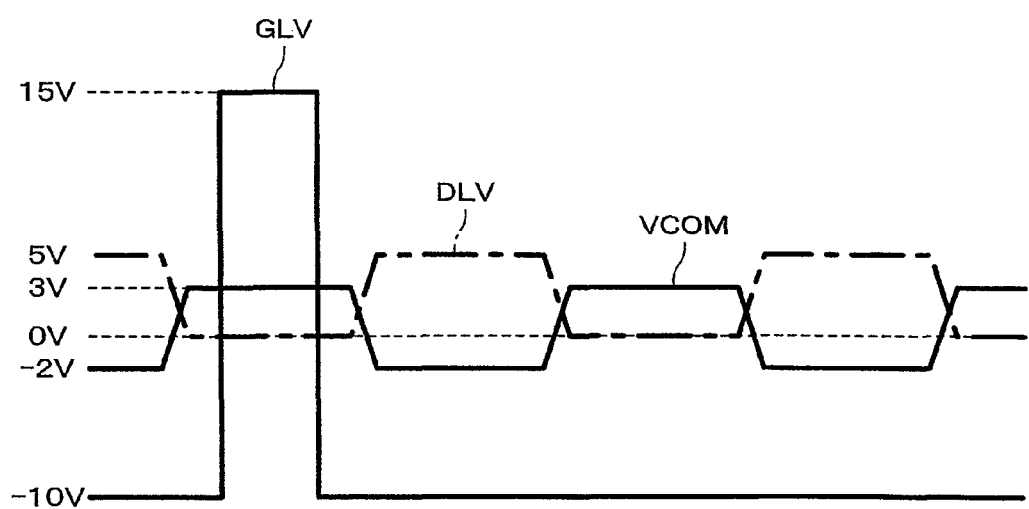
FIG. 6 shows an example of a drive waveform of a display panel shown in FIG. 1.

FIG. 6 shows an example of a drive waveform of the display panel 12 shown in FIG. 1.

A grayscale voltage DLV corresponding to the grayscale value of the display data is applied to the data line. In FIG. 6, the grayscale voltage DLV having an amplitude of 5 V with respect to the system ground power supply voltage VSS (=0 V) is applied.

A low-potential-side voltage VEE (=−10 V) is applied to the scan line during a nonselect period, and a high-potential-side voltage VDDHG (=15 V) is applied to the scan line during a select period, as a scan voltage GLV.

A high-potential-side voltage VCOMH (=3 V) or a low-potential-side voltage VCOML (=−2 V) is applied to the common electrode CE as the common voltage VCOM. The polarity of the voltage level of the common voltage VCOM based on a given voltage is reversed in synchronization with the polarity reversal timing. FIG. 6 shows the waveform of the common voltage VCOM during a scan line reversal drive. The polarity of the grayscale voltage DLV of the data line is also reversed based on a given voltage in synchronization with the polarity reversal timing.

1.4 Polarity Reversal Drive

A liquid crystal element deteriorates when a direct-current voltage is applied to the liquid crystal element for a long period of time. Therefore, a drive method in which the polarity of the voltage applied to the liquid crystal element is reversed in units of a predetermined period is necessary. As such a drive method, a frame reversal drive, a scan (gate) line reversal drive, a data (source) line reversal drive, a dot reversal drive, and the like can be given.

Of these, the frame reversal drive has a disadvantage in that the image quality is poor although power consumption is low. The data line reversal drive and the dot reversal drive have a disadvantage in that a high voltage is required to drive the display panel although the image quality is good.

Therefore, this embodiment employs the scan line reversal drive. In the scan line reversal drive, the polarity of the voltage applied to the liquid crystal element is reversed in scan period units (in units of scan lines). For example, a positive voltage is applied to the liquid crystal element in a first scan period (scan line), a negative voltage is applied in a second scan period, and a positive voltage is applied in a third scan period. In the next frame, a negative voltage is applied to the liquid crystal element in the first scan period, a positive voltage is applied in the second scan period, and a negative voltage is applied in the third scan period.

In the scan line reversal drive method, the polarity of the voltage level of the common voltage VCOM of the common electrode CE is reversed in scan period units.

Figure 7:
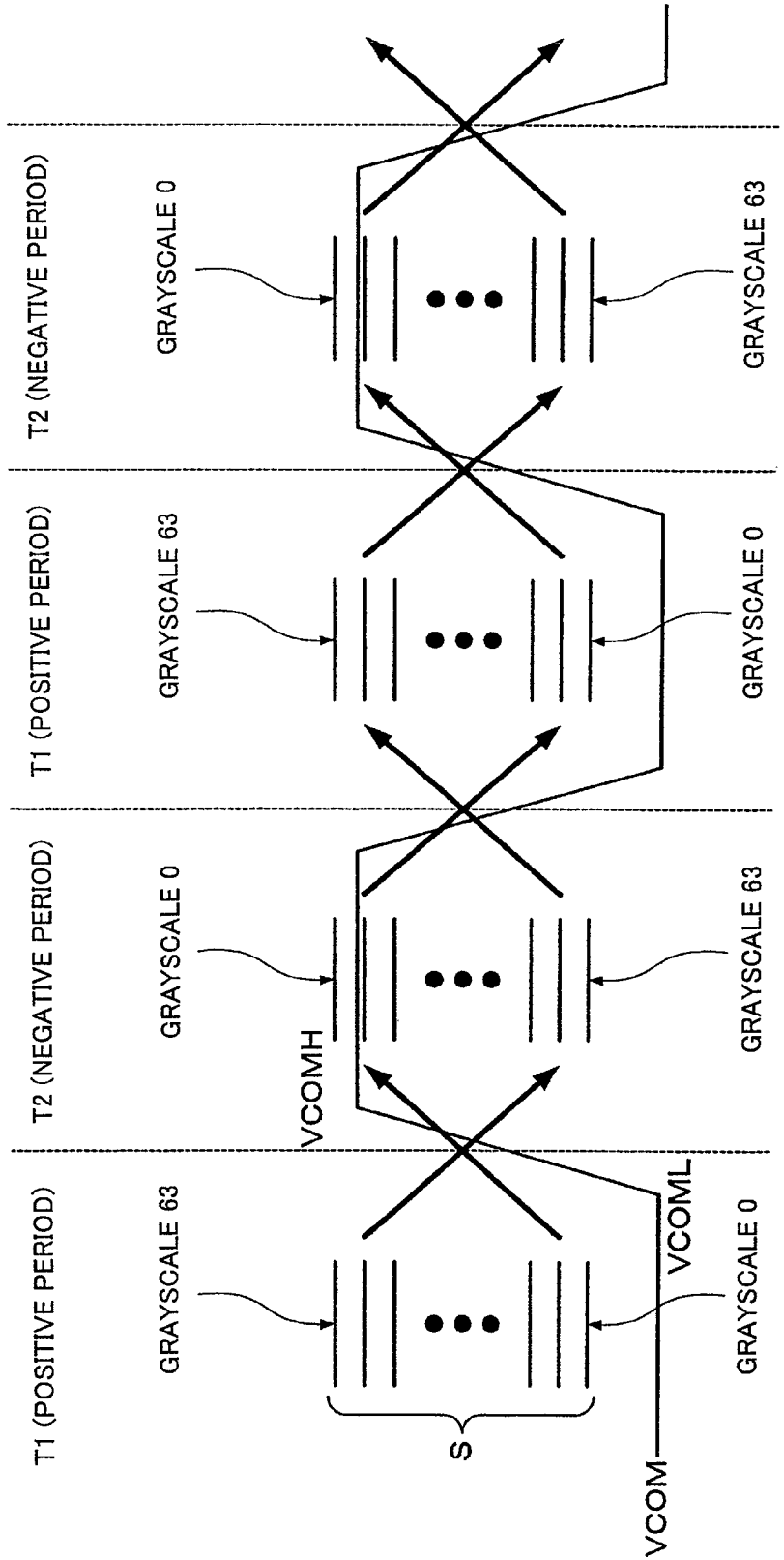
FIG. 7 is illustrative of a polarity reversal drive of a common electrode.

In more detail, the voltage level of the common voltage VCOM is the low-potential-side voltage VCOML in a positive period T1 (first period) and is the high-potential-side voltage VCOMH in a negative period T2 (second period), as shown in FIG. 7. The polarity of the grayscale voltage applied to the data line is also reversed in synchronization with this timing. The low-potential-side voltage VCOML is the voltage level obtained by reversing the polarity of the high-potential-side voltage VCOMH based on a given voltage level.

The positive period T1 is a period in which the voltage level of the pixel electrode to which the grayscale voltage of the data line is supplied is higher than the voltage level of the common electrode CE. In the period T1, a positive voltage is applied to the liquid crystal element. The negative period T2 is a period in which the voltage level of the pixel electrode to which the grayscale voltage of the data line is supplied is lower than the voltage level of the common electrode CE. In the period T2, a negative voltage is applied to the liquid crystal element.

The voltage necessary for driving the display panel can be reduced by reversing the polarity of the common voltage VCOM as described above. This enables the breakdown voltage of the driver circuit to be reduced, whereby the manufacturing process of the driver circuit can be simplified and cost can be reduced.

2. Common Voltage Generation Circuit

The common electrode CE to which the above-described common voltage VCOM is applied for performing the polarity reversal drive is an electrode formed over the common substrate, for example. Since the load capacity when driving the common electrode CE is high and the voltage level must be changed within a predetermined period, the common electrode CE is generally driven by using an operational amplifier having a high drive capability. For example, outputs from two operational amplifiers which generate the high-potential-side voltage VCOMH and the low-potential-side voltage VCOML are selectively output corresponding to the polarity reversal timing.

In this case, since the power supply voltage must be supplied to the operational amplifiers using a dual power supply method in order to sufficiently secure the amplitude of the outputs from the two operational amplifiers, it is difficult to reduce power consumption due to an increase in the width (the amplitude) of the power supply voltage of the operational amplifiers.

In this embodiment, in order to solve such a problem, power consumption is reduced by using a common voltage generation circuit having a configuration as described below.

Figure 8:
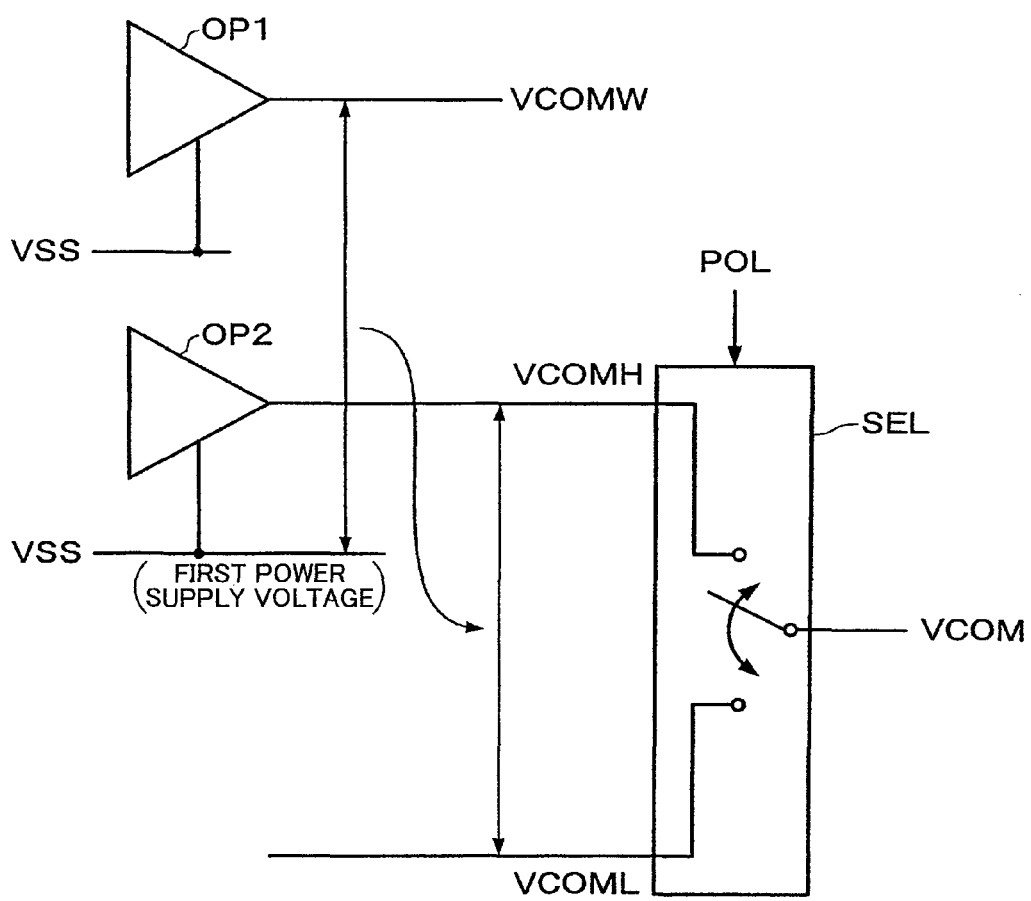
FIG. 8 shows a schematic configuration example of a common voltage generation circuit shown in FIG. 4.

FIG. 8 shows a schematic configuration example of the common voltage generation circuit 56 shown in FIG. 4.

The common voltage generation circuit 56 includes first and second operational amplifiers OP1 and OP2 and a select circuit SEL.

The first operational amplifier OP1 outputs an amplitude voltage VCOMW of the common voltage VCOM based on the system ground power supply voltage VSS (first power supply voltage in a broad sense). The second operational amplifier OP2 outputs the high-potential-side voltage VCOMH of the common voltage VCOM based on the system ground power supply voltage VSS.

The low-potential-side voltage VCOML which is lower in potential than high-potential-side voltage VCOMH for the voltage difference between the amplitude voltage VCOMW and the system ground power supply voltage VSS is generated by a charge-pump operation. The select circuit SEL outputs the high-potential-side voltage VCOMH or the low-potential-side voltage VCOML as the common voltage VCOM corresponding to the logical level of the polarity reversal signal POL.

As described above, the low-potential-side voltage VCOML of the common voltage VCOM is not output from an operational amplifier, but is generated by the charge-pump operation.

Since the transmissivity of a pixel changes corresponding to the difference between the voltage of the pixel electrode and the voltage of the common electrode, the target value of the deviation of the voltage applied to the liquid crystal is generally 5 to 20 mV. Since color non-uniformity is confirmed by naked eye observation when the deviation becomes equal to or exceeds the above value, the applied voltage must be set with high accuracy. Since it is difficult to stably and periodically output the voltage to the common electrode within the deviation when using a charge pump output having a low drive capability, the applied voltage has been set using an operational amplifier.

However, the present inventor has confirmed that the effect on the image quality of the entire liquid crystal panel cannot be identified by naked eye observation by setting the common voltage within a predetermined deviation, even if the voltage is output to the common electrode using a charge pump output. Therefore, deterioration of the image quality can be prevented even if the voltage is output to the common electrode using the charge pump output as described above.

It becomes unnecessary to supply the power supply voltage using a dual power supply method by employing the configuration in this embodiment. Therefore, the width of the power supply voltage of the operational amplifier for generating the common voltage can be reduced, and the number of operational amplifiers can be reduced. This reduces power consumption.

Figure 9:
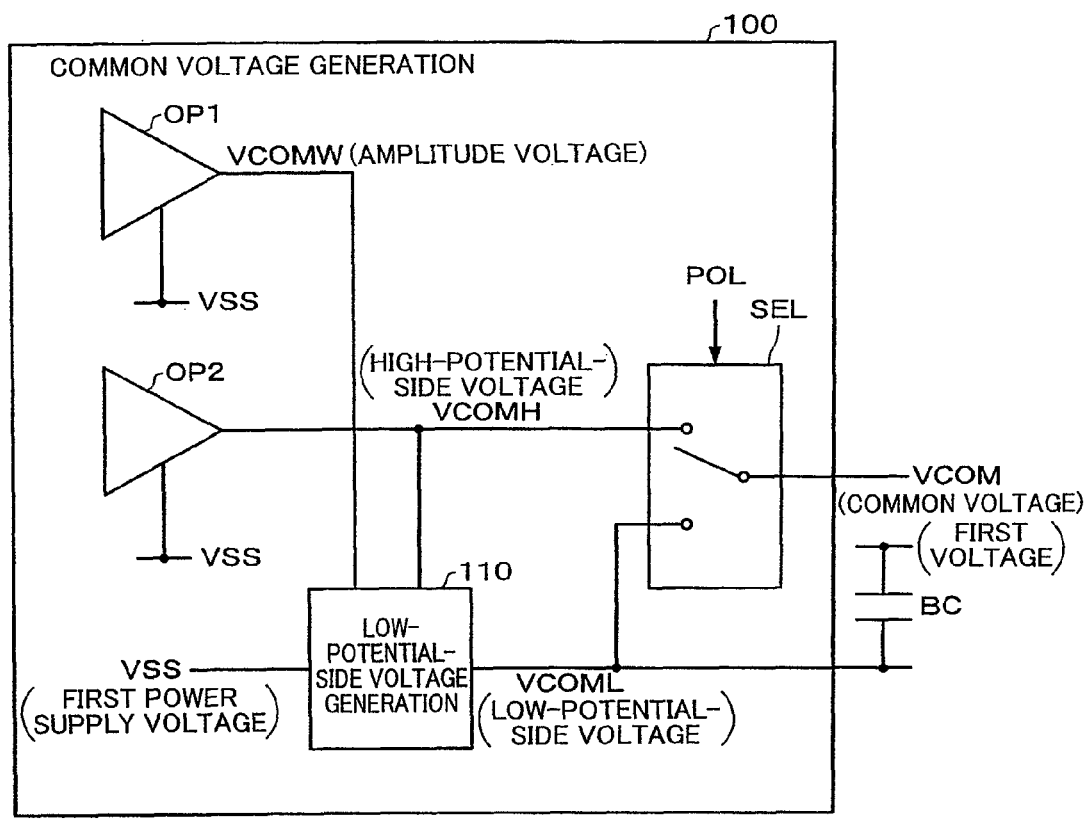
FIG. 9 shows an example of a principle configuration of a common voltage generation circuit in this embodiment.

FIG. 9 shows an example of a principle configuration diagram of the common voltage generation circuit in this embodiment. In FIG. 9, sections the same as the sections of the common voltage generation circuit 56 shown in FIG. 8 are indicated by the same symbols. Description of these sections is appropriately omitted.

This common voltage generation circuit 100 may be applied to the power supply circuit 50 shown in FIG. 4. The common voltage generation circuit 100 includes first and second operational amplifiers OP1 and OP2 and a low-potential-side voltage generation circuit 110.

The first operational amplifier OP1 outputs the amplitude voltage VCOMW of the common voltage VCOM based on the system ground power supply voltage VSS (first power supply voltage). The second operational amplifier OP2 outputs the high-potential-side voltage VCOMH of the common voltage VCOM based on the system ground power supply voltage VSS (first power supply voltage).

The low-potential-side voltage generation circuit 110 supplies the low-potential-side voltage VCOML of the common voltage VCOM which is lower in potential than the high-potential-side voltage VCOMH for the amplitude voltage VCOMW to one terminal (the other end) of a backup capacitor BC by a charge-pump operation. A given first voltage (system ground power supply voltage VSS, for example) is supplied to the other terminal (one end) of the backup capacitor BC. The backup capacitor BC may be included in the common voltage generation circuit 100 or the like (common voltage generation circuit 100 or a power supply circuit including the common voltage generation circuit 100). The backup capacitor BC may be externally provided so that the backup capacitor BC is connected with the common voltage generation circuit 100 or the like through an external connection terminal of the common voltage generation circuit 100 or the like.

The common voltage generation circuit 100 supplies the high-potential-side voltage VCOMH or the low-potential-side voltage VCOML thus generated to the common electrode CE. Therefore, the common voltage generation circuit 100 may include a select circuit SEL. The select circuit SEL outputs the high-potential-side voltage VCOMH or the low-potential-side voltage VCOML corresponding to the logical level of the polarity reversal signal POL.

Figure 10:
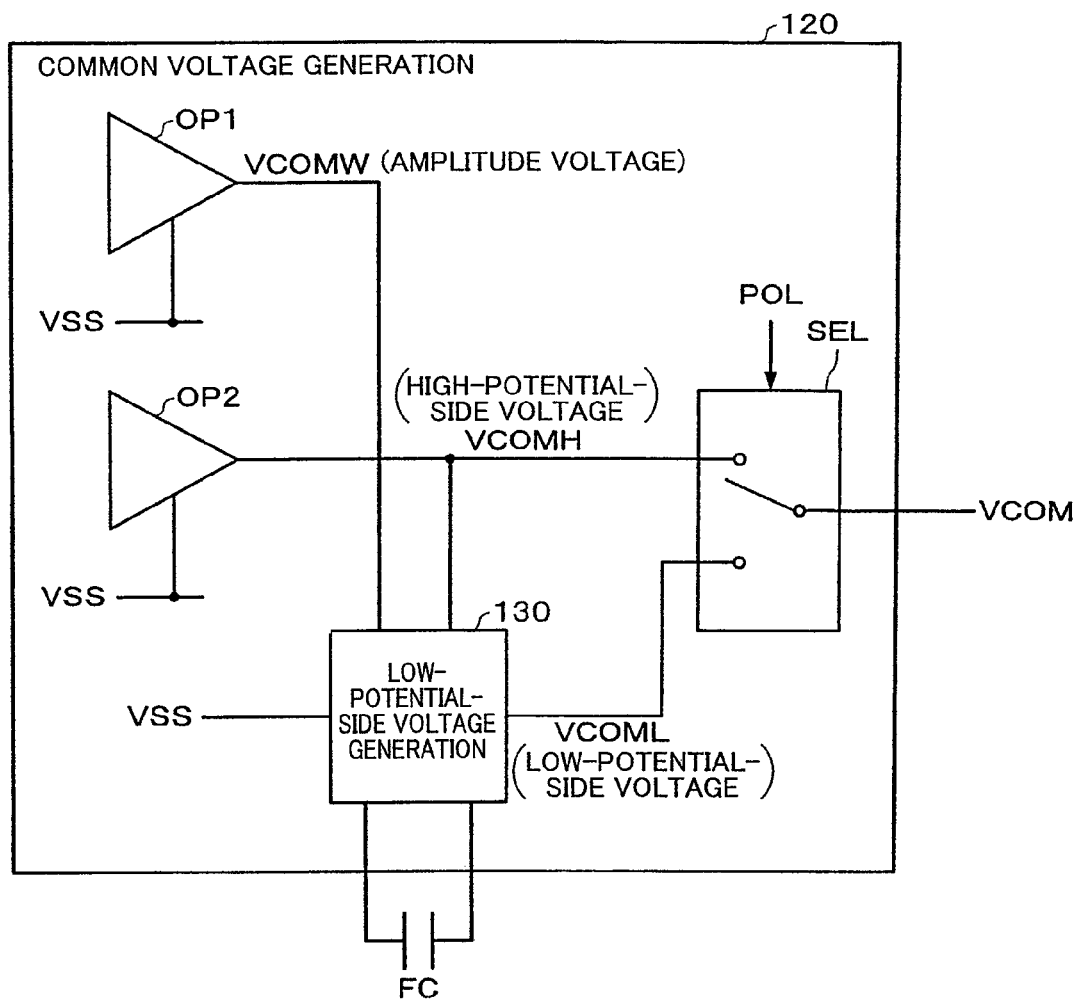
FIG. 10 shows another example of a principle configuration diagram of a common voltage generation circuit in this embodiment.

FIG. 10 shows another example of a principle configuration diagram of a common voltage generation circuit in this embodiment. In FIG. 10, sections the same as the sections shown in FIG. 9 are indicated by the same symbols. Description of these sections is appropriately omitted.

This common voltage generation circuit 120 may be applied to the power supply circuit 50 shown in FIG. 4. The common voltage generation circuit 120 includes first and second operational amplifiers OP1 and OP2 and a low-potential-side voltage generation circuit 130.

The low-potential-side voltage generation circuit 130 supplies the high-potential-side voltage VCOMH to one end of a flying capacitor FC which stores an electric charge corresponding to the voltage difference between the system ground power supply voltage VSS (first power supply voltage) and the amplitude voltage VCOMW. This enables the low-potential-side voltage generation circuit 130 to generate the low-potential-side voltage VCOML of the common voltage VCOM which is lower in potential than the high-potential-side voltage VCOMH for the amplitude voltage VCOMW. The flying capacitor FC may be included in the common voltage generation circuit 120 or the like (common voltage generation circuit 120 or a power supply circuit including the common voltage generation circuit 120). The flying capacitor FC may be externally provided so that the flying capacitor FC is connected with the common voltage generation circuit 120 or the like through an external connection terminal of the common voltage generation circuit 120 or the like.

The common voltage generation circuit 120 supplies the high-potential-side voltage VCOMH or the low-potential-side voltage VCOML thus generated to the common electrode CE. Therefore, the common voltage generation circuit 120 may include a select circuit SEL.

Figure 11:
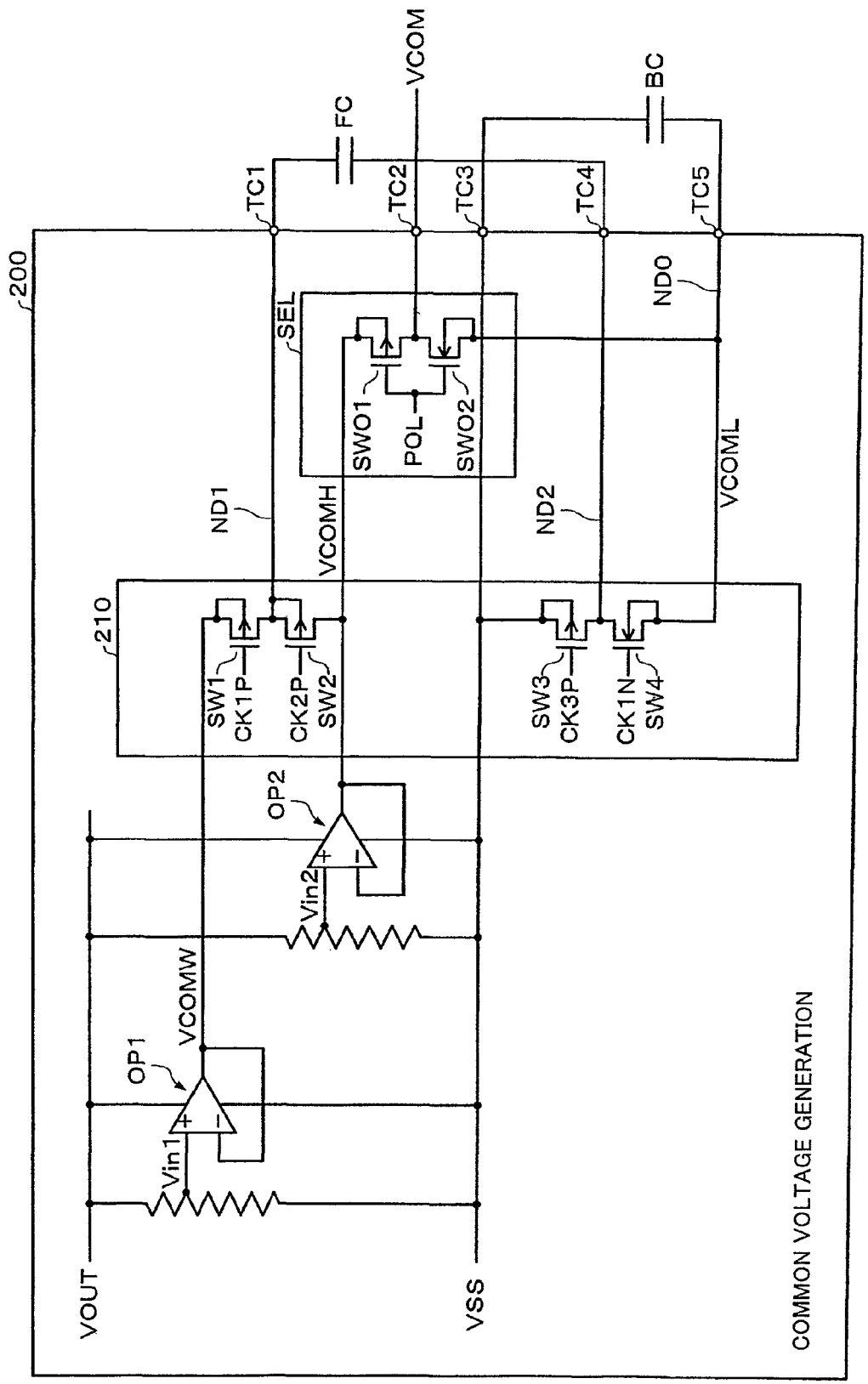
FIG. 11 is a circuit diagram of a configuration example of a common voltage generation circuit in this embodiment.

FIG. 11 is a circuit diagram of a configuration example of a common voltage generation circuit in this embodiment. This common voltage generation circuit 200 may be considered to be a specific configuration example of the common voltage generation circuit 100 or 120 shown in FIG. 9 or 10.

The first operational amplifier OP1 is formed by a voltage-follower-connected operational amplifier. The first operational amplifier OP1 operates using the power supply voltage VOUT and the system ground power supply voltage VSS as power supplies. The power supply voltage VOUT is generated by the power supply circuit 50 shown in FIG. 4. A signal input to a noninverting input terminal (+terminal) of the first operational amplifier OP1 is a divided voltage Vin1 obtained by dividing the voltage difference between the power supply voltage VOUT and the system ground power supply voltage VSS using resistors. The output from the first operational amplifier OP1 is connected with an inverting input terminal (−terminal). The first operational amplifier OP1 can stably supply the amplitude voltage VCOMW as the output voltage corresponding to the divided voltage Vin1, since the input impedance is high and the output impedance is low.

The second operational amplifier OP2 is formed by a voltage-follower-connected operational amplifier. The second operational amplifier OP2 operates using the power supply voltage VOUT and the system ground power supply voltage VSS as power supplies. A signal input to a noninverting input terminal (+terminal) of the second operational amplifier OP2 is a divided voltage Vin2 obtained by dividing the voltage difference between the power supply voltage VOUT and the system ground power supply voltage VSS using resistors. The output from the second operational amplifier OP2 is connected with an inverting input terminal (−terminal). The second operational amplifier OP2 can stably supply the high-potential-side voltage VCOMH of the common voltage VCOM as the output voltage corresponding to the divided voltage Vin2, since the input impedance is high and the output impedance is low.

A low-potential-side voltage generation circuit 210 includes first to fourth switch elements SW1 to SW4. The first and second switch elements SW1 and SW2 are connected in series. The amplitude voltage VCOMW and the high-potential-side voltage VCOMH are supplied to either end of the first and second switch elements SW1 and SW2 connected in series. The third and fourth switch elements SW3 and SW4 are connected in series. The system ground power supply voltage VSS (first power supply voltage) is supplied to one end of the third switch element SW3. The other end of the third switch element SW3 is connected with one end of the fourth switch element SW4. The voltage of the other end of the fourth switch element SW4 is the low-potential-side voltage VCOML of the common voltage VCOM.

The first to fourth switch elements SW1 to SW4 are ON/OFF controlled using a switch control signal. The first to third switch elements SW1 to SW3 are formed by p-channel MOS transistors, and the fourth switch element SW4 is formed by an n-channel MOS transistor. Charge clock signals CK1P to CK3P and CK1N are input to gate electrodes of the MOS transistors, and the MOS transistors are ON/OFF controlled by the charge clock signals CK1P to CK3P and CK1N.

A connection node ND1 of the first and second switch elements SW1 and SW2 is connected with an external connection terminal TC1. A connection node ND2 of the third and fourth switch elements SW3 and SW4 is connected with an external connection terminal TC4. The flying capacitor FC is connected between the external connection terminals TC1 and TC4 outside the common voltage generation circuit 200.

The select circuit SEL includes first and second output switch elements SWO1 and SWO2. The first and second output switch elements SWO1 and SWO2 are connected in series. The high-potential-side voltage VCOMH and the low-potential-side voltage VCOML of the common voltage VCOM are supplied to either end of the first and second output switch elements SWO1 and SWO2.

The first output switch element SWO1 is formed by a p-channel MOS transistor as a first output transistor. The second output switch element SWO2 is formed by an n-channel MOS transistor as a second output transistor. The polarity reversal signal POL is supplied to gate electrodes of the output transistors.

A connection node of the first and second output switch elements SWO1 and SWO2 is connected with an external connection terminal TC2. The common voltage VCOM is supplied to the common electrode CE connected with the external connection terminal TC2.

A source electrode of the third switch element SW3 is connected with an external connection terminal TC3. A source electrode of the fourth switch element SW4 is connected with an external connection terminal TC5. The system ground power supply voltage VSS is supplied to the source electrode of the third switch element SW3. The low-potential-side voltage VCOML of the common voltage VCOM is supplied to the source electrode of the fourth switch element SW4. The backup capacitor BC is connected between the external connection terminals TC3 and TC5 outside the common voltage generation circuit 200.

Figure 12:
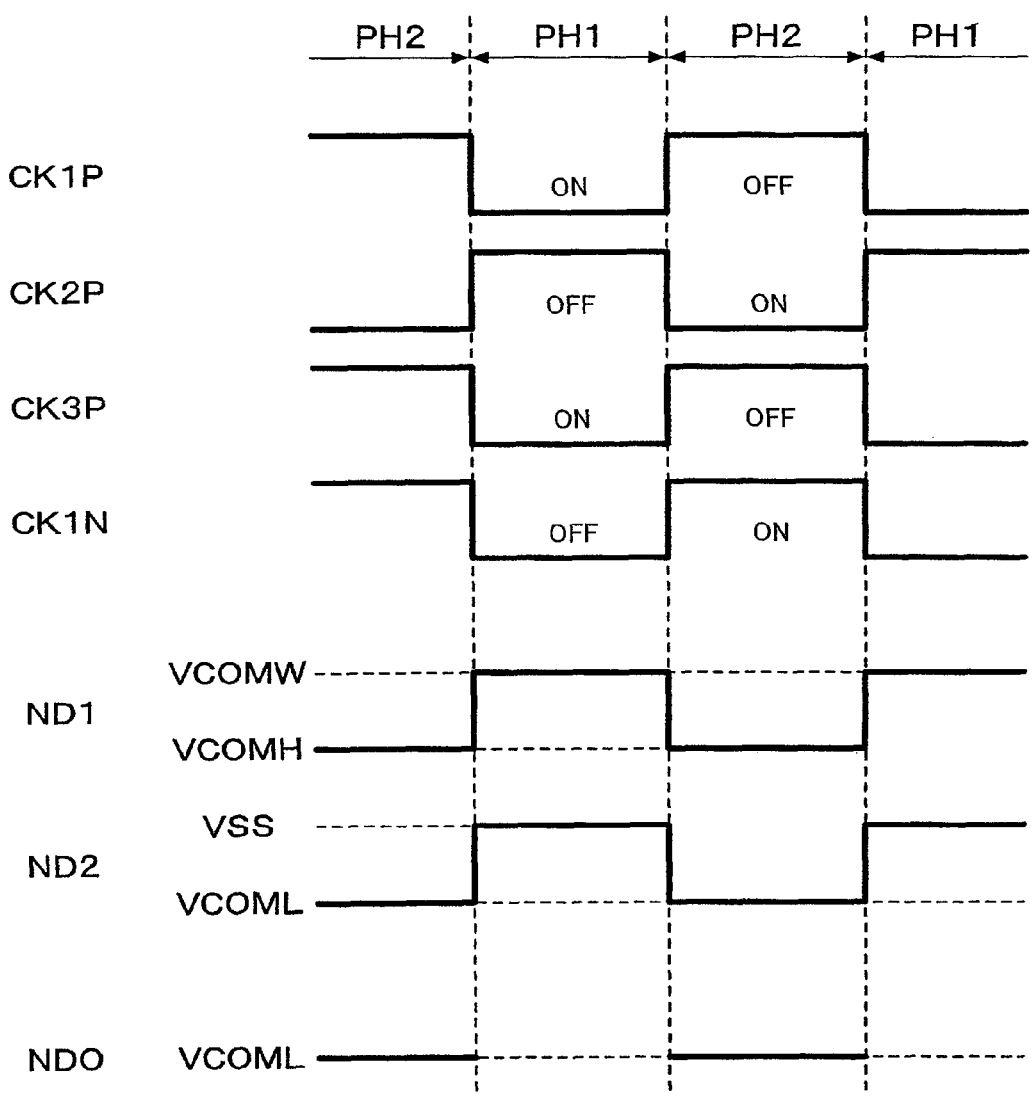
FIG. 12 is a timing diagram of an operation example of the common voltage generation circuit shown in FIG. 11.

FIG. 12 is a timing diagram of an operation example of the common voltage generation circuit 200 shown in FIG. 11.

FIG. 12 schematically shows changes in the charge clock signals CK1P to CK3P and CK1N and the connection nodes ND1, ND2, and NDO. Suppose that the MOS transistor is an ideal switch element without resistance and loss of the circuit element is absent for convenience of description.

Each of the charge clock signals CK1P to CK3P and CK1N has two periods (PH1 and PH2). The charge clock signals CK1P and CK3P are signals which change at the same time. The charge clock signals CK2P and CK1N are signals which change at the same time. It is preferable that the charge clock signals CK1P and CK2P do not change at the same time. It is preferable that the charge clock signals CK3P and CK1N do not change at the same time.

In the phase PH1 (first period), the charge clock signals CK1P, CK3P, and CK1N are set at the L level, and the charge clock signal CK2P is set at the H level. Therefore, the first switch element SW1 is turned on and the second switch element SW2 is turned off, whereby the amplitude voltage VCOMW is supplied to the connection node ND1. Therefore, the amplitude voltage VCOMW is supplied to one end of the flying capacitor FC. In the phase PH1, the third switch element SW3 is turned on and the fourth switch element SW4 is turned off, whereby the system ground power supply voltage VSS (first power supply voltage) is supplied to the connection node ND2. Therefore, the system ground power supply voltage VSS is supplied to the other end of the flying capacitor FC.

In the phase PH2 (second period subsequent to the first period), the charge clock signals CK1P, CK3P, and CK1N are set at the H level, and the charge clock signal CK2P is set at the L level. Therefore, the first switch element SW1 is turned off and the second switch element SW2 is turned on, whereby the high-potential-side voltage VCOMH is supplied to the connection node ND1. Therefore, the high-potential-side voltage VCOMH is supplied to one end of the flying capacitor FC. In the phase PH2, the third switch element SW3 is turned off and the fourth switch element SW4 is turned on, whereby the voltage of the other end of the flying capacitor FC is supplied to the connection node NDO. Therefore, the voltage of the other end of the flying capacitor FC is supplied to one end of the backup capacitor BC.

Figure 13A:
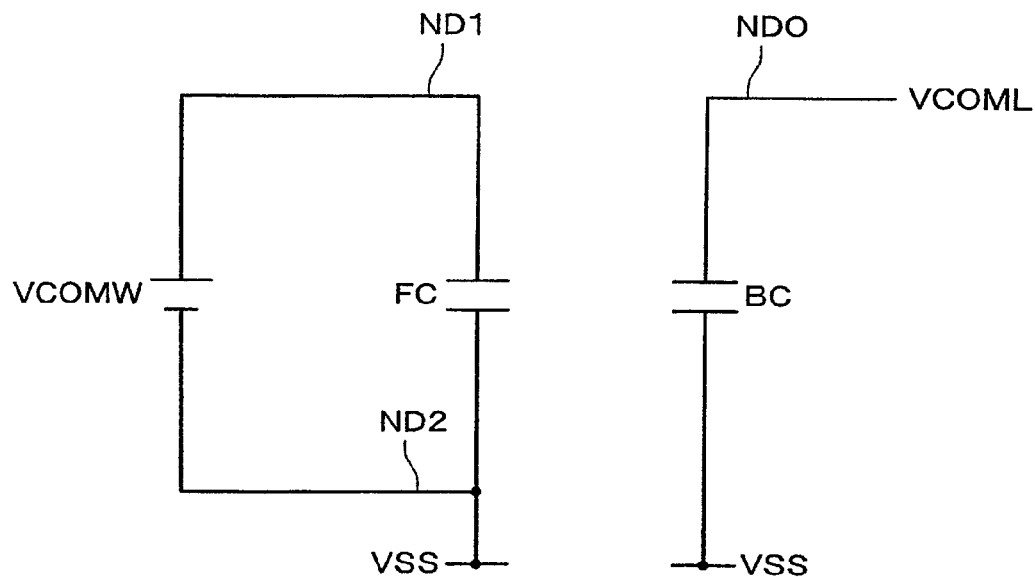
FIGS. 13A and 13B show equivalent circuits of a low-potential-side voltage generation circuit in each phase.
Figure 13B:
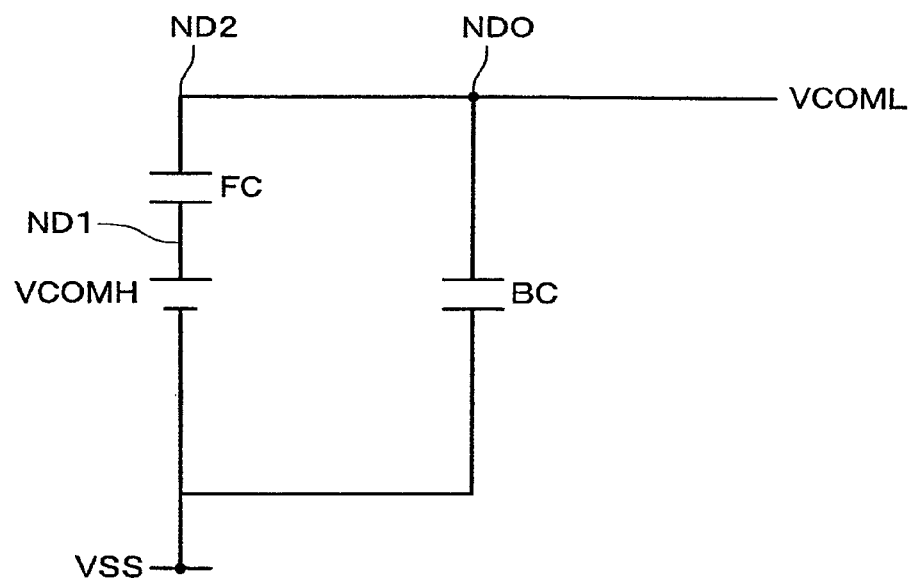

FIGS. 13A and 13B show equivalent circuits of the low-potential-side voltage generation circuit 210 in the phases PH1 and PH2.

FIG. 13A shows an equivalent circuit in the phase PH1. In the phase PH1, the voltage difference between the amplitude voltage VCOMW and the system ground power supply voltage VSS occurs across the ends of the flying capacitor FC. Suppose that the system ground power supply voltage VSS is 0 V (volt) and the capacitance of the flying capacitor FC is C1, an electric charge Q1 charged into the flying capacitor FC is "C1×VCOMW".

FIG. 13B shows an equivalent circuit in the phase PH2. In the phase PH2, the high-potential-side voltage VCOMH is supplied to the terminal of the flying capacitor FC to which the positive voltage is supplied in the phase PH1. Therefore, the other end of the flying capacitor FC is at a voltage which is lower than the high-potential-side voltage VCOMH for a voltage corresponding to the electric charge Q1. Specifically, in the phase PH2, the voltage of the other end of the flying capacitor FC is (VCOMH−VCOMW), whereby (VCOMH−VCOMW) is supplied to the connection node NDO as the low-potential-side voltage VCOML.

An electric charge is charged into the backup capacitor BC to which (VCOMH−VCOMW) is supplied, and the phase PH1 occurs again. When the fourth switch element SW4 is turned off, the electric charge charged into the backup capacitor BC is discharged to the common electrode CE. However, since an electric charge is repeatedly supplied from the flying capacitor FC, the low-potential-side voltage VCOML is maintained as the voltage of the connection node NDO.

The common voltage generation circuit 200 shown in FIG. 11 uses a p-channel operational amplifier as the first operational amplifier OP1. The common voltage generation circuit 200 uses an n-channel operational amplifier as the second operational amplifier OP2.

Figure 14:
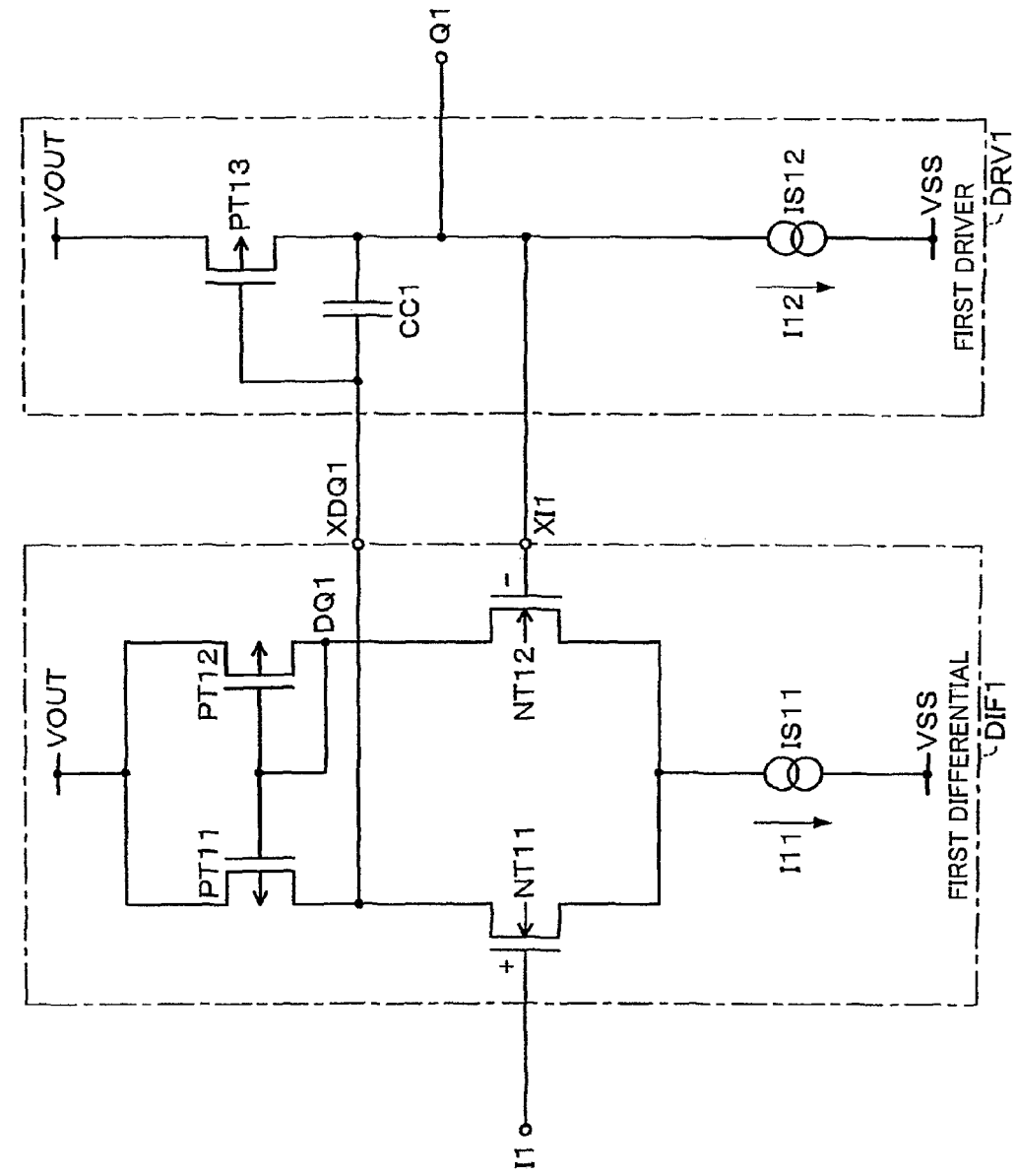
FIG. 14 is a circuit diagram of a configuration example of a first operational amplifier using a p-channel operational amplifier.

FIG. 14 is a circuit diagram of a configuration example of the first operational amplifier OP1 using a p-channel operational amplifier.

The first operational amplifier OP1 is a voltage-follower-connected operational amplifier, and its output is driven by a p-channel driver transistor PT13. The first operational amplifier OP1 includes a first differential section DIF1 and a first driver section DRV1, and is formed by voltage-follower-connecting the first differential section DIF1 and the first driver section DRV1.

The first driver section DRV1 includes the p-channel driver transistor PT13, but does not include an n-channel driver transistor. The first driver section DRV1 includes the p-channel driver transistor PT13 and a current source IS12. The p-channel driver transistor PT13 is connected with the power supply voltage VOUT (second power supply voltage) at one end, and is connected with the output of the first operational amplifier OP1 at the other end. The current source IS12 is connected with the system ground power supply voltage (first power supply voltage) at one end, and is connected with the output of the first operational amplifier OP1 at the other end. In FIG. 14, a capacitor CC1 is used for phase compensation.

The first differential section DIF1 includes p-channel transistors PT11 and PT12 of which gate electrodes are connected with an output DQ1 of the first differential section DIF1, n-channel transistors NT11 and NT12 of which gate electrodes are respectively connected with inputs I1 and XI1 of the first differential section DIF1, and a current source IS11 provided on the side of the system ground power supply voltage VSS (first power supply voltage).

The first operational amplifier OP1 is voltage-follower-connected in which an output Q1 is connected with the input XI1 (inverting input) of the first differential section DIF1.

Figure 15:
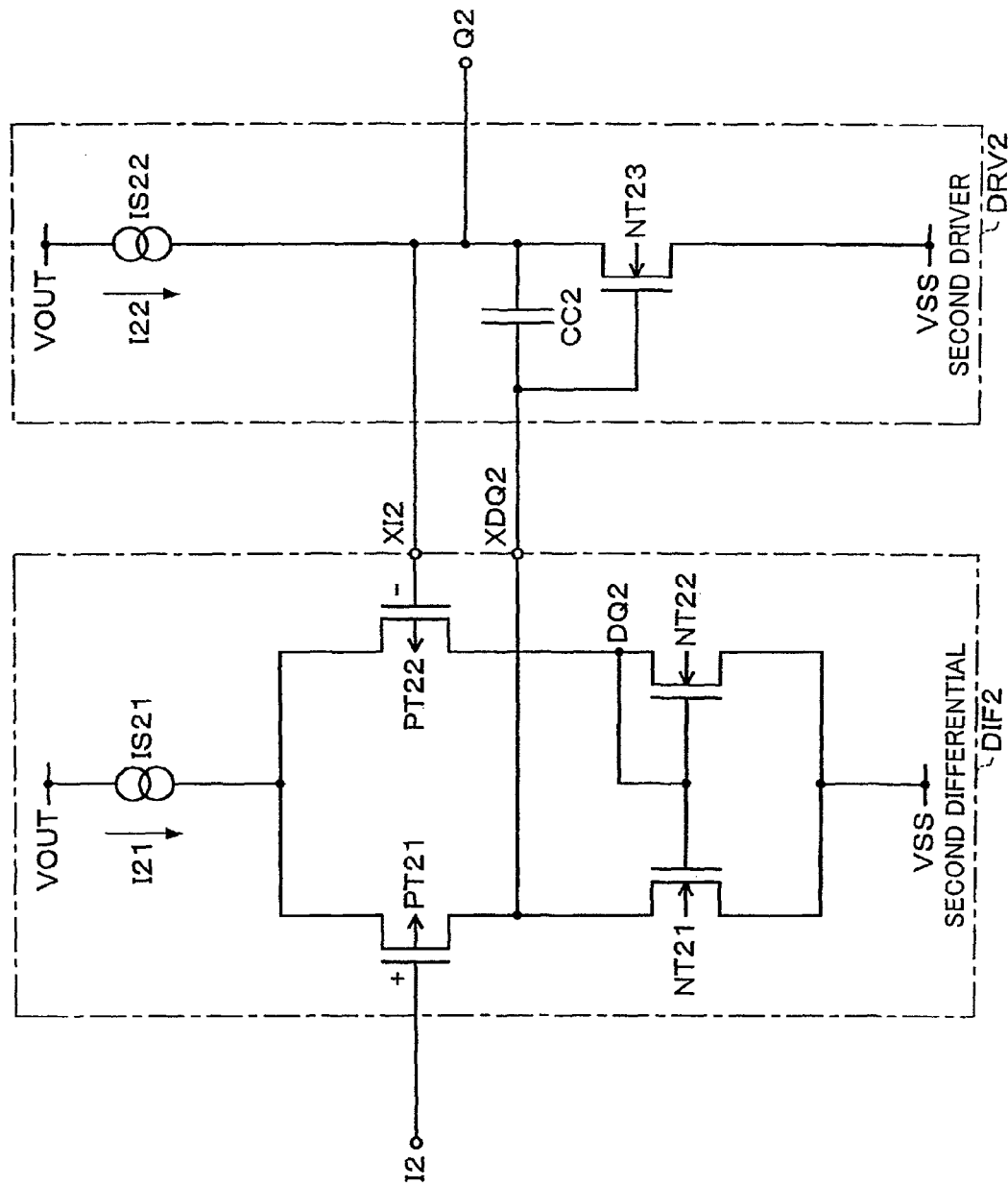
FIG. 15 is a circuit diagram of a configuration example of a second operational amplifier using an n-channel operational amplifier.

FIG. 15 is a circuit diagram of a configuration example of the second operational amplifier OP2 using an n-channel operational amplifier.

The second operational amplifier OP2 is a voltage-follower-connected operational amplifier, and its output is driven by an n-channel driver transistor NT23. The second operational amplifier OP2 includes a second differential section DIF2 and a second driver section DRV2, and is formed by voltage-follower-connecting the second differential section DIF2 and the second driver section DRV2.

The second driver section DRV2 includes the n-channel driver transistor NT23, but does not include a p-channel driver transistor. The second driver section DRV2 includes the n-channel driver transistor NT23 and a current source IS22. The n-channel driver transistor NT23 is connected with the system ground power supply voltage (first power supply voltage) at one end, and is connected with the output of the second operational amplifier OP2 at the other end. The current source IS22 is connected with the power supply voltage VOUT (second power supply voltage) at one end, and is connected with the output of the second operational amplifier OP2 at the other end. In FIG. 15, a capacitor CC2 is used for phase compensation.

The second differential section DIF2 includes n-channel transistors NT21 and NT22 of which gate electrodes are connected with an output DQ2 of the second differential section DIF2, p-channel transistors PT21 and PT22 of which gate electrodes are respectively connected with inputs I2 and XI2 of the second differential section DIF2, and a current source IS21 provided on the side of the power supply voltage VOUT (second power supply voltage).

The second operational amplifier OP2 is voltage-follower-connected in which an output Q2 is connected with the input XI2 (inverting input) of the second differential section DIF2.

In the first operational amplifier OP1 shown in FIG. 14, current flows through only paths I11 and I12. In the second operational amplifier OP2 shown in FIG. 15, current flows through only paths I21 and I22. Therefore, the first and second operational amplifiers OP1 and OP2 can reduce the amount of unnecessary current in comparison with a class-AB operational amplifier circuit having three or more current paths, whereby power consumption can be reduced.

In the first operational amplifier OP1, the amount of current I12 flowing through the current source IS12 can be significantly reduced when it is unnecessary to decrease the voltage level of the output Q1 toward the low potential side to a large extent. In the common voltage generation circuit 200 shown in FIG. 11, when the amplitude voltage VCOMW of the common voltage VCOM is higher in potential than the high-potential-side voltage VCOMH of the common voltage VCOM, it is unnecessary for the first operational amplifier OP1 to decrease the potential of one end of the flying capacitor FC toward the low potential side. Therefore, power consumption can be reduced by using a p-channel operational amplifier as the first operational amplifier OP1.

In the second operational amplifier OP2, the amount of current I22 flowing through the current source IS22 can be significantly reduced when it is unnecessary to increase the voltage level of the output Q2 toward the high potential side to a large extent. In the common voltage generation circuit 200 shown in FIG. 11, when the amplitude voltage VCOMW of the common voltage VCOM is higher in potential than the high-potential-side voltage VCOMH of the common voltage VCOM, it is unnecessary for the second operational amplifier OP2 to decrease the potential of one end of the flying capacitor FC toward the high potential side. Therefore, power consumption can be reduced by using an n-channel operational amplifier as the second operational amplifier OP2.

2.1 Comparative Example

A comparative example in which the power supply voltage is supplied using a dual power supply method is described below in order to describe the effect of this embodiment.

Figure 16:
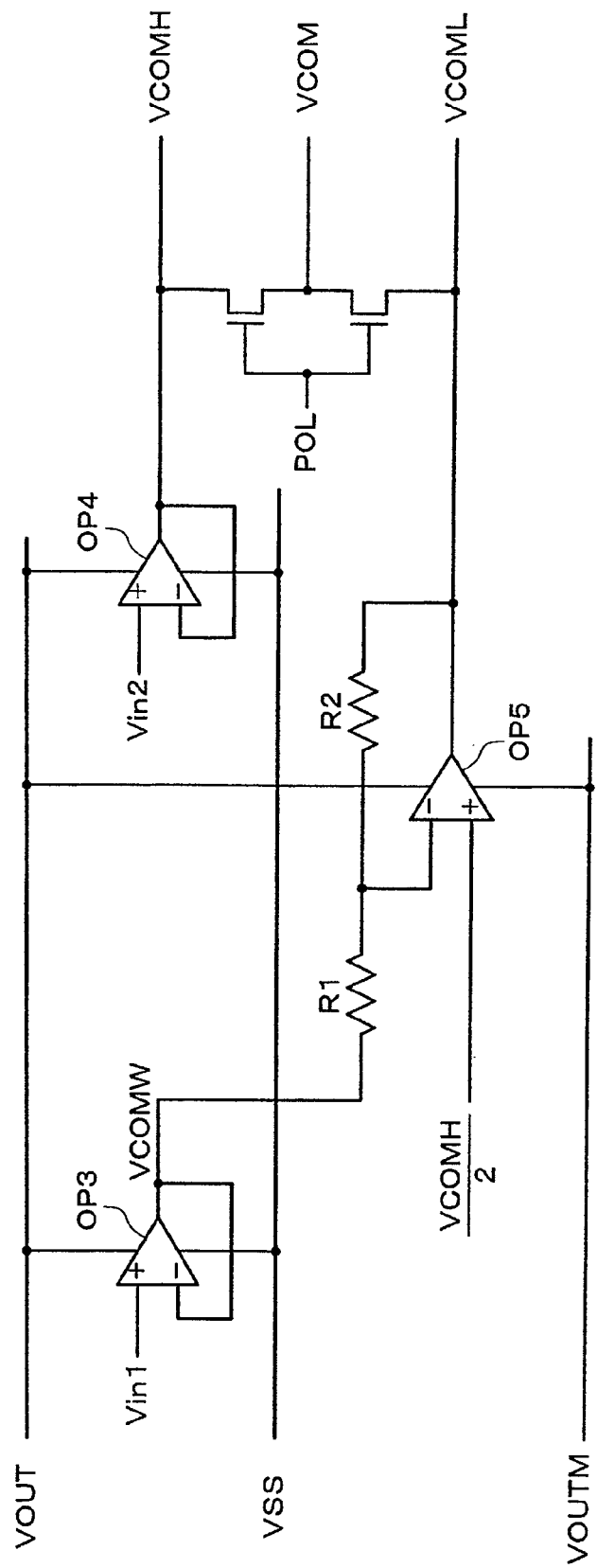
FIG. 16 is a circuit diagram of a configuration example of a common voltage generation circuit in a comparative example of this embodiment.

FIG. 16 is a circuit diagram of a configuration example of a common voltage generation circuit in a comparative example of this embodiment. In FIG. 16, sections the same as the sections of the common voltage generation circuit 200 in this embodiment shown in FIG. 11 are indicated by the same symbols. Description of these sections is appropriately omitted.

The common voltage generation circuit in the comparative example includes third to fifth operational amplifiers OP3 to OP5. The third operational amplifier OP3 outputs the amplitude voltage VCOMW using the voltage between the power supply voltage VOUT (second power supply voltage) and the system ground power supply voltage VSS (first power supply voltage) as the power supply voltage. The fourth operational amplifier OP4 outputs the high-potential-side voltage VCOMH of the common voltage VCOM using the voltage between the power supply voltage VOUT and the system ground power supply voltage VSS as the power supply voltage.

The fifth operational amplifier OP5 operates as a subtractor circuit including resistor elements (R1 and R2), and outputs the low-potential-side voltage VCOML of the common voltage VCOM. In more detail, a divided voltage obtained by dividing the voltage between the low-potential-side voltage VCOML, which is the output voltage, and the amplitude voltage VCOMW using the resistor elements (R1 and R2) is supplied to an inverting input terminal of the fifth operational amplifier OP5. When the resistances of the resistor elements R1 and R2 are the same, a voltage half of the high-potential-side voltage VCOMH is supplied to a noninverting input terminal of the fifth operational amplifier OP5.

The subtractor circuit formed by using the fifth operational amplifier OP5 is described below.

Figure 17:
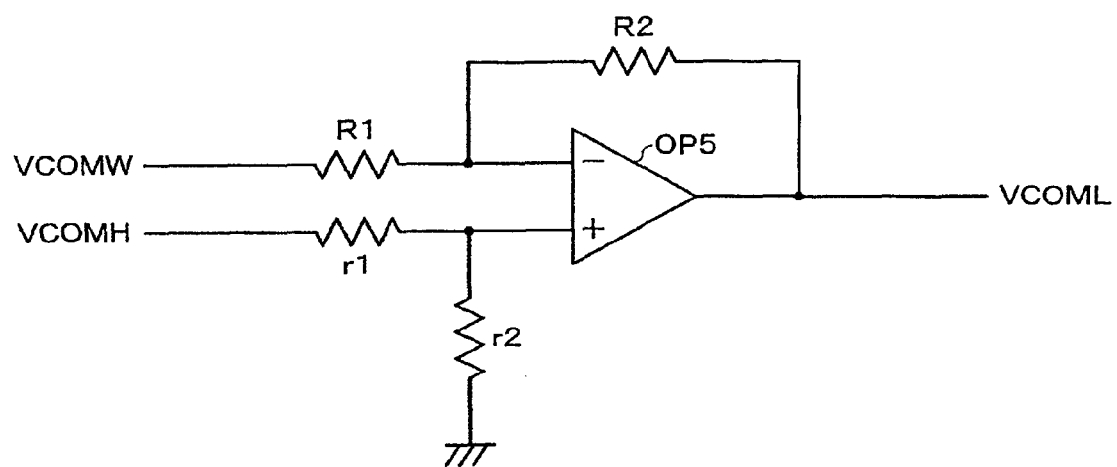
FIG. 17 shows a configuration example of a subtractor circuit formed using a fifth operational amplifier.

FIG. 17 shows a configuration example of the subtractor circuit formed by using the fifth operational amplifier OP5.

A voltage obtained by dividing the voltage between the low-potential-side voltage VCOML, which is the output voltage, and the amplitude voltage VCOMW using the resistor elements (R1 and R2) is supplied to the inverting input terminal of the fifth operational amplifier OP5. A voltage obtained by dividing the voltage between the system ground power supply voltage VSS and the high-potential-side voltage VCOMH using resistor elements (r1 and r2) is supplied to the noninverting input terminal of the fifth operational amplifier OP5.

Such a subtractor circuit may be considered to be a composite circuit of an inverting amplifier circuit formed by using the fifth operational amplifier OP5 and a noninverting amplifier circuit formed by using the fifth operational amplifier OP5.

Figure 18:
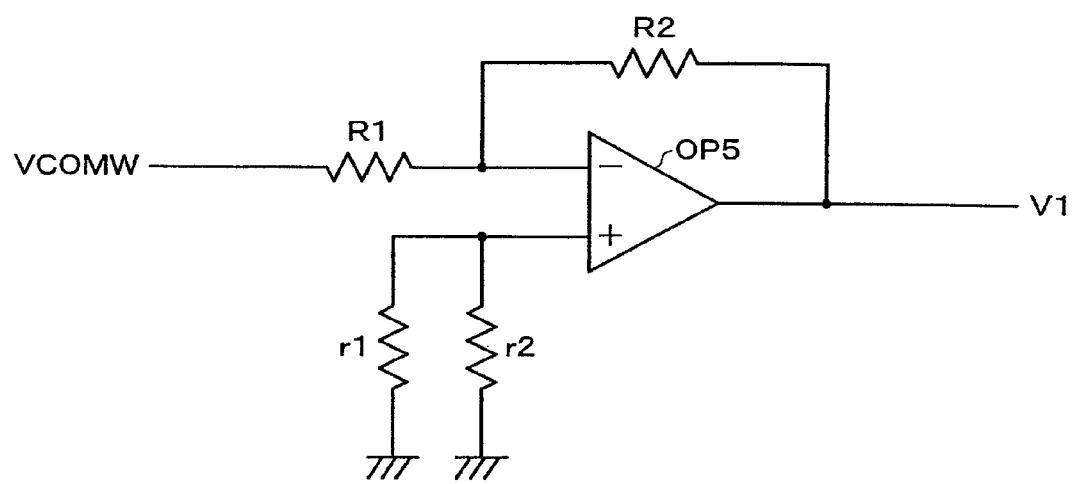
FIG. 18 shows a configuration example of an inverting amplifier circuit formed using the fifth operational amplifier.

FIG. 18 shows a configuration example of the inverting amplifier circuit formed by using the fifth operational amplifier OP5.

In FIG. 18, the high-potential-side voltage VCOMH shown in FIG. 17 is the system ground power supply voltage VSS. Since the input impedance of the fifth operational amplifier OP5 is very high, current does not flow into the fifth operational amplifier OP5 through the inverting input terminal. Therefore, an output V1 of the inversion amplifier circuit shown in FIG. 18 is expressed by the following equation (1).

$$V1 = -(R2/R1) \cdot VCOMW \quad (1)$$

Specifically, the amplification factor can be determined by the ratio of the resistor elements R1 and R2 irrespective of the amplification factor of the fifth operational amplifier OP5. Since the input voltage is supplied to the inverting input terminal, the polarities of the input signal and the output signal are reversed.

Figure 19:
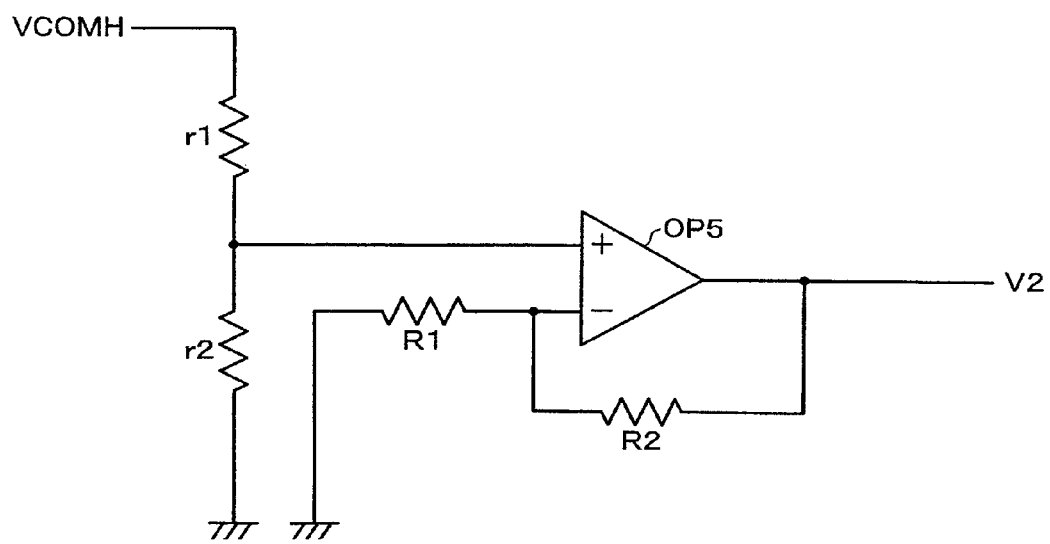
FIG. 19 shows a configuration example of a noninverting amplifier circuit formed using the fifth operational amplifier.

FIG. 19 shows a configuration example of the noninverting amplifier circuit formed by using the fifth operational amplifier OP5.

In FIG. 19, the amplitude voltage VCOMW shown in FIG. 17 is the system ground power supply voltage VSS. Since the input impedance of the fifth operational amplifier OP5 is very high, current does not flow into the fifth operational amplifier OP5 through the inverting input terminal. Therefore, an output V2 of the noninverting amplifier circuit shown in FIG. 19 is expressed by the following equation (2).

$$V2=(1+(R2/R1))\cdot(r2/(r1+r2))\cdot \text{VCOMH} \quad (2)$$

Specifically, the amplification factor can be determined by the ratio of the resistor elements R1, R2, r1, and r2 irrespective of the amplification factor of the fifth operational amplifier OP5, and the output voltage equal to or greater than the input voltage can be output. Since the input voltage is supplied to the noninverting input terminal, the polarities of the input signal and the output signal are not reversed.

Therefore, the output VCOML of the subtractor circuit shown in FIG. 17 is "V1+V2".

$$\text{VCOML}=V1+V2=-(R2/R1)\cdot\text{VCOMW}+(1+(R2/R1))\cdot(r2/(r1+r2))\cdot\text{VCOMH} \quad (3)$$

Suppose that R1 equals R2 and r1 equals r2, the low-potential-side voltage VCOML is expressed by the following equation (4).

$$\text{VCOML}=\text{VCOMH}-\text{VCOMW} \quad (4)$$

Therefore, the subtractor circuit shown in FIG. 17 outputs the voltage obtained by subtracting the voltage obtained by dividing the voltage between the low-potential-side voltage VCOML and the amplitude voltage VCOMW using the resistor elements R1 and R2 from the voltage obtained by dividing the high-potential-side voltage VCOMH using the resistor elements r1 and r2 as the low-potential-side voltage VCOML. The polarity of the low-potential-side voltage VCOML is the reverse of the polarity of the voltage input to the inverting input terminal.

As described above, the fifth operational amplifier OP5 shown in FIG. 16 outputs the voltage obtained by subtracting the amplitude voltage VCOMW from the high-potential-side voltage VCOMH as the low-potential-side voltage VCOML when the resistances of the resistor elements R1 and R2 are the same.

The common voltage generation circuit in the comparative example shown in FIG. 16 outputs one of the high-potential-side voltage VCOMH output from the fourth operational amplifier OP4 and the low-potential-side voltage VCOML output from the fifth operational amplifier OP5 as the common voltage VCOM corresponding to the logical level of the polarity reversal signal POL.

Figure 20:
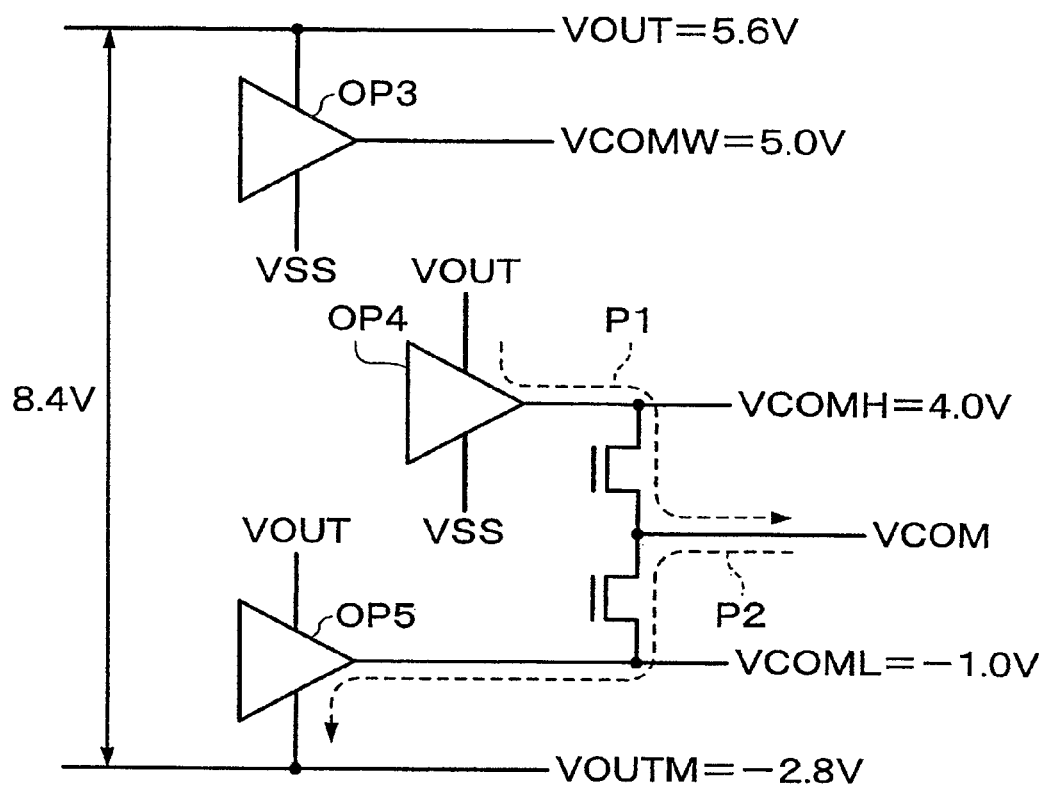
FIG. 20 schematically shows an example of various power supply voltages of the common voltage generation circuit in the comparative example shown in FIG. 16.

FIG. 20 schematically shows an example of various power supply voltages of the common voltage generation circuit in the comparative example shown in FIG. 16.

Suppose that the maximum amplitude of the drive signal of the data line is 5.0 V and the system ground power supply voltage VSS is 0 V, the amplitude voltage VCOMW of the common voltage VCOM applied to the common electrode opposite to the pixel electrode to which the drive signal of the data line is supplied must be 5.0 V. Therefore, the high-potential-side power supply voltage of the third operational amplifier OP3 is set at 5.6 V as a voltage higher than the maximum output voltage of 5.0 V, for example. Therefore, the power supply voltage VOUT is 5.6 V.

The common voltage VCOM has an offset potential in advance in the negative direction with respect to the pixel voltage. Therefore, the low-potential-side voltage VCOML of the common voltage VCOM is lower in potential than the system ground power supply voltage VSS. This is a measure to ensure that a desired voltage is applied to the liquid crystal element even when electric charges stored in the pixel electrode are divided by the parasitic capacitor of the TFT when the TFT which forms the pixel is turned off.

Figure 21:
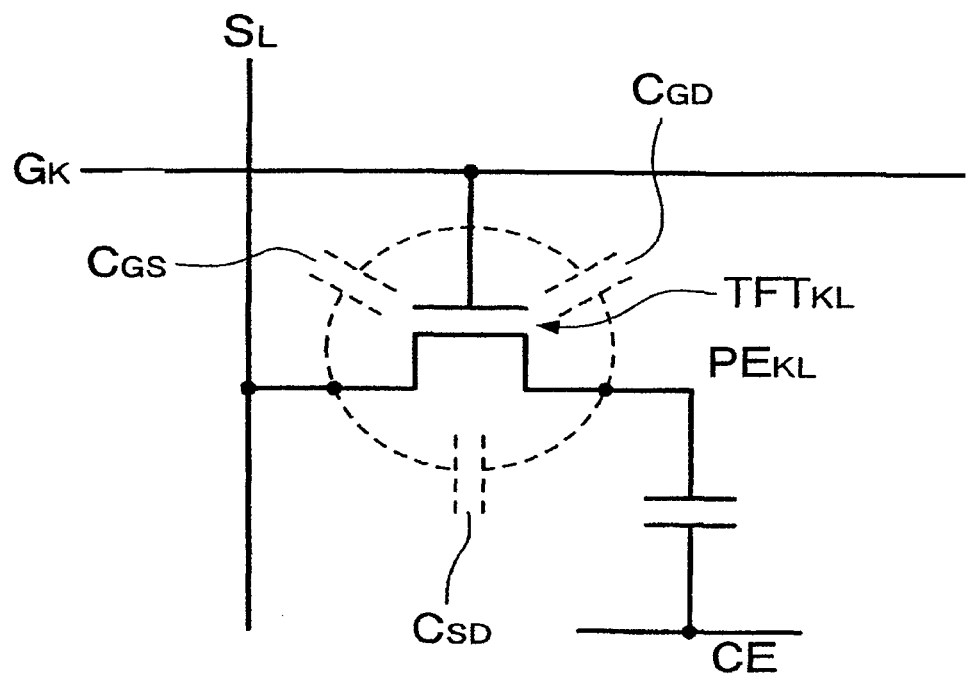
FIG. 21 is illustrative of parasitic capacitance of a TFT.

FIG. 21 is an explanatory diagram of the parasitic capacitor of the TFT.

FIG. 21 shows only the thin film transistor $\text{TFT}_{KL}$. Parasitic capacitors $C_{SD}$, $C_{GD}$, and $C_{GS}$ respectively exist between the source and the drain, between the gate and the drain, and between the gate and the source of the thin film transistor $\text{TFT}_{KL}$. A scan voltage having an amplitude between 15 V and −10 V is supplied to the gate electrode of the thin film transistor $\text{TFT}_{KL}$, for example. When the scan voltage having a potential of 15 V is supplied to the thin film transistor $\text{TFT}_{KL}$, the thin film transistor $\text{TFT}_{KL}$ is turned on, whereby the drive signal of 5 V at maximum applied to the data line $S_L$ is supplied to the pixel electrode $\text{PE}_{KL}$.

When the scan voltage of the thin film transistor $\text{TFT}_{KL}$ is set at a potential of −10 V, the thin film transistor $\text{TFT}_{KL}$ is turned off. Electric charges charged into the pixel electrode $\text{PE}_{KL}$ are divided by the parasitic capacitors $C_{SD}$, $C_{GD}$, and $C_{GS}$ due to the gate voltage having a very high amplitude, whereby the amount of electric charge charged into the pixel electrode $\text{PE}_{KL}$ is decreased.

Therefore, an offset potential (−1 V or −2 V, for example) is provided in advance to the common voltage VCOM in the negative direction so that a voltage higher than the original voltage is supplied to the pixel electrode $\text{PE}_{KL}$ when the thin film transistor $\text{TFT}_{KL}$ is turned on taking a decrease in the amount of electric charge due to capacitive division into consideration.

In FIG. 20, the offset potential is set at 1 V, the high-potential-side voltage VCOMH of the common voltage VCOM is set at 4.0 V, and the low-potential-side voltage VCOML is set at −1.0 V. Therefore, the low-potential-side power supply voltage of the fifth operational amplifier OP5 which outputs the low-potential-side voltage VCOML is set at −2.8 V as a voltage lower than −1.0 V.

As described above, in the comparative example, it is necessary to supply the power supply voltage using a dual power supply method in order to sufficiently secure the amplitude of the outputs from the third and fifth operational amplifiers OP3 and OP5. In this case, current paths P1 and P2 are formed from the common voltage generation circuit to the common electrode CE. In the comparative example, since the power supply voltages of the third to fifth operational amplifiers OP3 to OP5 are in the range from the power supply voltage VOUT to the low-potential-side power supply voltage VOUTM, current is consumed in the range of 8.4 (=5.6+2.8) V in order to drive the common electrode CE.

2.2 Effect of Present Embodiment

The effect of the common voltage generation circuit in this embodiment is described below by comparing this embodiment with the comparative example described with reference to FIGS. 16 to 21.

Figure 22:
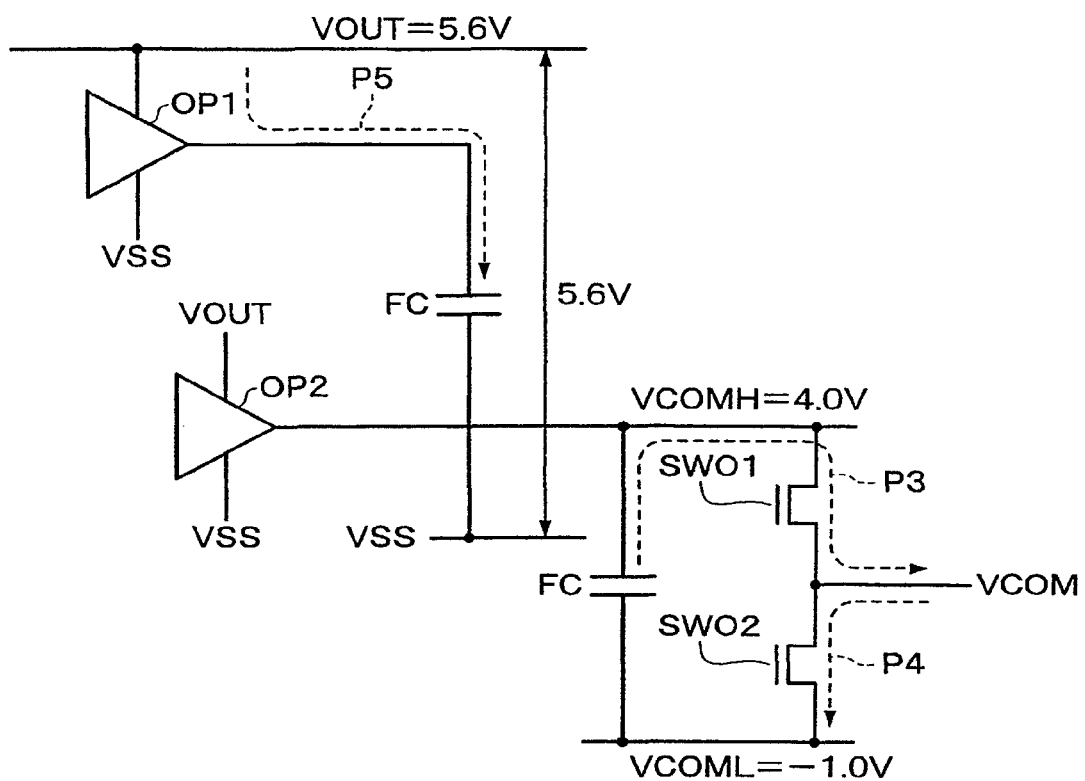
FIG. 22 schematically shows an example of various power supply voltages of the common voltage generation circuit in this embodiment shown in FIG. 11.

FIG. 22 schematically shows an example of various power supply voltages of the common voltage generation circuit in this embodiment shown in FIG. 11. In FIG. 22, sections the same as the sections shown in FIG. 11 are indicated by the same symbols. Description of these sections is omitted.

In FIG. 22, the system ground power supply voltage VSS is 0 V, the power supply voltage VOUT is 5.6 V, the high-potential-side voltage VCOMH of the common voltage VCOM is 4.0 V, and the low-potential-side voltage VCOML is −1.0 V.

In this embodiment, current paths P3 and P4 are formed from the common voltage generation circuit to the common electrode CE. Therefore, the common electrode CE is driven by the flying capacitor FC in this embodiment. The voltage supplied across the ends of the flying capacitor FC is switched by the charge-pump operation as described above, and an electric charge is charged into the flying capacitor FC by the first operational amplifier OP1 (path P5). Therefore, in this embodiment, it suffices that the power supply voltage of the first operational amplifier OP1 be in the range from the power supply voltage VOUT to the system ground power supply voltage VSS. Specifically, in this embodiment, current is consumed in the range of 5.6 V in order to drive the common electrode CE.

Figure 23A:
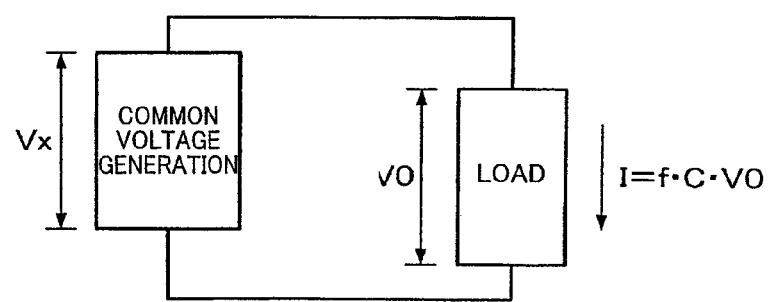
FIG. 23A is a diagram illustrative of power consumption of a common voltage generation circuit in this embodiment.

FIG. 23A is an explanatory diagram of power consumption of the common voltage generation circuit in this embodiment. Suppose that the common voltage generation circuit in this embodiment operates at a voltage in the range of a voltage Vx (5.6 V in FIG. 22), for example. Suppose that the amplitude of the common voltage VCOM applied to the common electrode CE which is a load is V0, and a current charged into and discharged from the common electrode CE is I. The amplitude V0 of the common voltage VCOM is a voltage between the high-potential-side voltage VCOMH and the low-potential-side voltage VCOML. Suppose that the load capacitance of the common electrode CE is C and the frequency of the polarity reversal timing of the common voltage VCOM is f, the charge/discharge current I is f·C·V0. Therefore, power consumption W0 of the common voltage generation circuit in this embodiment equals "I·Vx=f·C·V0·Vx".

Figure 23B:
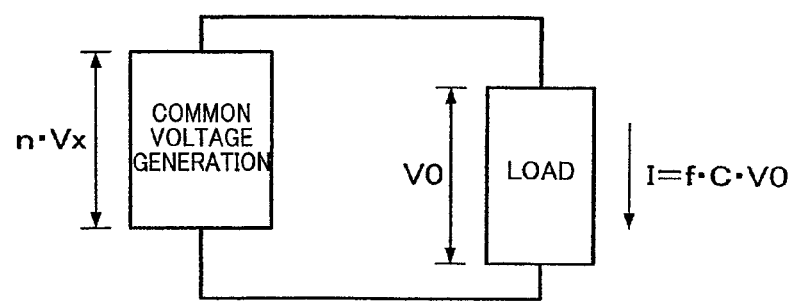
FIG. 23B is a diagram illustrative of power consumption of a common voltage generation circuit in the comparative example.

FIG. 23B is an explanatory diagram of power consumption of the common voltage generation circuit in the comparative example. Suppose that the common voltage generation circuit in the comparative example operates at a voltage in the range of a voltage n·Vx (n is a real number greater than 1) (8.4 V in FIG. 20), for example. The amplitude of the common voltage VCOM, the load capacitance of the common electrode CE, and the frequency of the polarity reversal timing of the common voltage VCOM in the comparative example are the same as those in this embodiment. Therefore, the current I charged into and discharged from the common electrode CE in the comparative example is the same as that in this embodiment. Therefore, power consumption W1 of the common voltage generation circuit in the comparative example equals "I·n·Vx=f·C·V0·n·Vx".

As described above, in this embodiment, power consumption can be reduced by 1/n in comparison with the comparative example. In the examples shown in FIGS. 20 and 22, power consumption can be reduced by ⅔, whereby a significant reduction of power consumption can be realized.

In this embodiment, since an operational amplifier which outputs the low-potential-side voltage VCOML of the common voltage VCOM can be omitted, the number of paths through which current consumed by the common voltage generation circuit flows can be reduced in comparison with the comparative example.

In this embodiment, when the potential of the amplitude voltage VCOMW is higher than the potential of the high-potential-side voltage VCOMH, it is unnecessary for the first operational amplifier OP1 to decrease the potential of one end of the flying capacitor FC toward the low potential side. Therefore, the first operational amplifier OP1 can be formed by a p-channel operational amplifier as shown in FIG. 14. Therefore, since the amount of current flowing through the current source of the first driver section of the p-channel operational amplifier can be reduced, power consumption can be further reduced.

When the potential of the amplitude voltage VCOMW is higher than the potential of the high-potential-side voltage VCOMH, it suffices that the second operational amplifier OP2 supply current to such an extent that the high-potential-side voltage VCOMH is not decreased. Therefore, the second operational amplifier OP2 can be formed by an n-channel operational amplifier as shown in FIG. 15. Therefore, since the amount of current flowing through the current source of the second driver section of the n-channel operational amplifier can be reduced, power consumption can be further reduced.

As described above, according to this embodiment, the number of operational amplifiers can be reduced. Moreover, the operational amplifier which outputs the high-potential-side voltage VCOMH can be prevented from contributing to driving the common electrode CE differing from the comparative example.

In this embodiment, deterioration of the image quality can be prevented, even when using a charge pump output having a low drive capability, by decreasing the output impedance as described below.

In order to decrease the output impedance of the common voltage generation circuit 200 in this embodiment shown in FIG. 11, it is effective to decrease the impedance when the first and second output switch elements SWO1 and SWO2 which form the select circuit SEL are set in the conducting state. In the case where the first and second output switch elements SWO1 and SWO2 are formed by MOS transistors, it is effective to increase the channel width W of each MOS transistor.

In the case where the first and second output switch elements SWO1 and SWO2 are formed by MOS transistors, the first and second output switch elements SWO1 and SWO2 may be respectively called first and second output transistors. In this case, the output impedance may be decreased by setting the amplitude of the gate voltages of the first and second output transistors to be greater than the voltage difference between the high-potential-side voltage VCOMH and the low-potential-side voltage VCOML.

Since the low-potential-side voltage VCOML is lower than the system ground power supply voltage VSS, the common voltage generation circuit 200 in this embodiment is formed by using a triple-well structure. Therefore, the breakdown voltage of the MOS transistor formed by using a triple-well structure formation process is the highest breakdown voltage in the process. In this case, the impedance can be further decreased when the transistor is turned on by setting the amplitude of the gate voltages of the first and second output transistors to be greater than the voltage difference between the high-potential-side voltage VCOMH and the low-potential-side voltage VCOML in comparison with the case where the amplitude of the gate voltages of the first and second output transistors is the voltage difference between the high-potential-side voltage VCOMH and the low-potential-side voltage VCOML.

Figure 24:
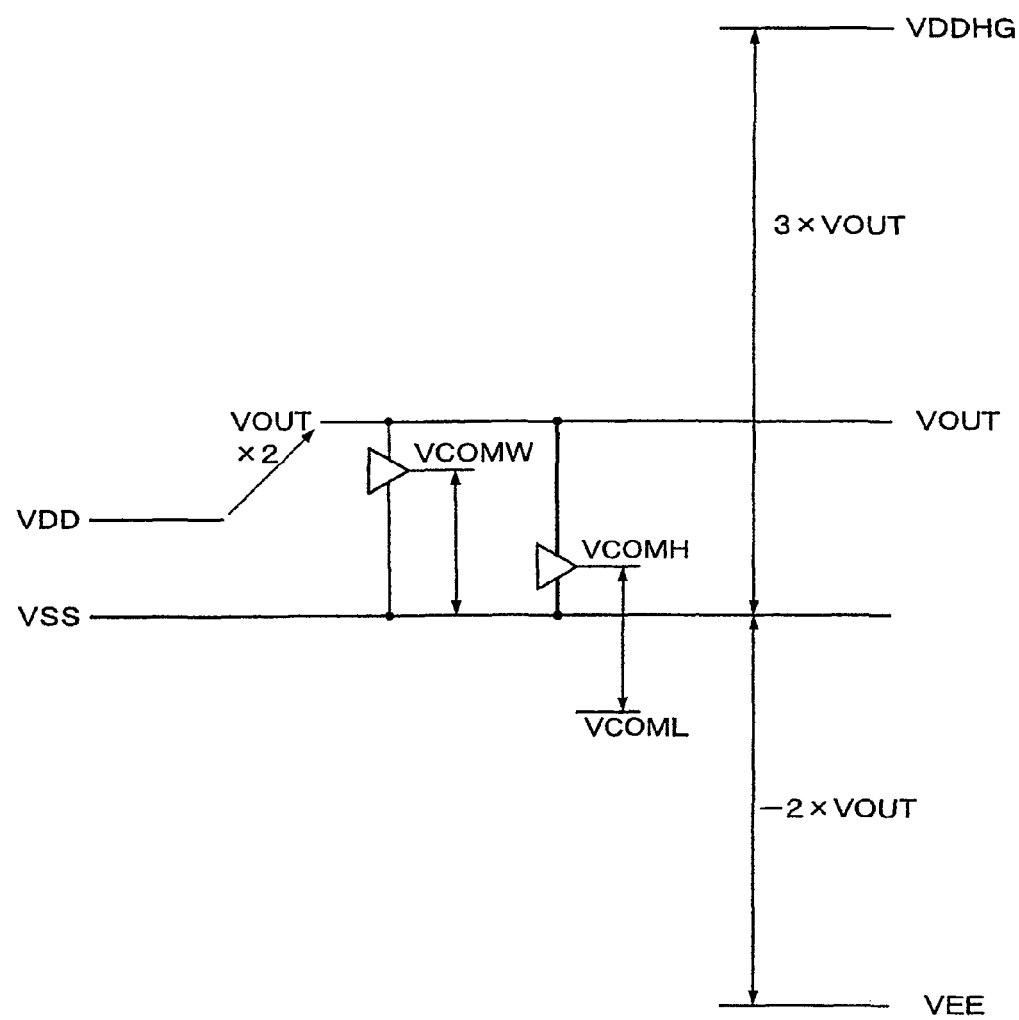
FIG. 24 is illustrative of a potential relationship in the power supply circuit shown in FIG. 4.

FIG. 24 is an explanatory diagram of the potential relationship in the power supply circuit shown in FIG. 4.

In the case where the power supply circuit including the common voltage generation circuit in this embodiment includes the scan voltage generation circuit as shown in FIG. 4, since the voltage between the high-potential-side voltage and the low-potential-side voltage of the scan voltage is very high, the power supply circuit is formed by using a high voltage process. Therefore, the impedance of the transistor can be further decreased by setting the amplitude of the gate voltages of the first and second output transistors to be the same as the amplitude of the scan voltage applied to the scan line.

Figure 25:
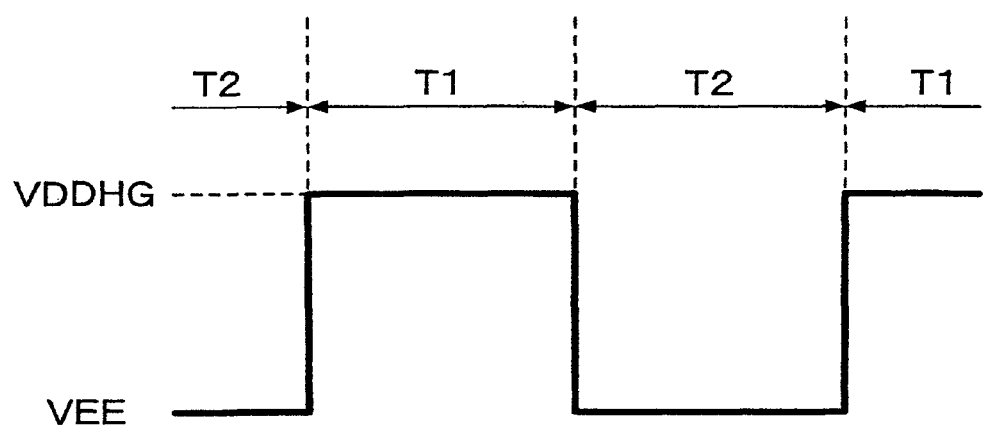
FIG. 25 shows an example of gate voltages of MOS transistors which form first and second output switch elements.

In this case, a gate voltage shown in FIG. 25 is supplied to the first and second output transistors.

In the case where the first to fourth switch elements SW1 to SW4 which form the low-potential-side voltage generation circuit 210 are formed by MOS transistors, it is preferable to set the amplitude of the gate voltage of each MOS transistor as described below.

Specifically, it is preferable that the amplitude of the gate voltages of the MOS transistors which form the first and second switch elements SW1 and SW2 be greater than the voltage difference between the amplitude voltage VCOMW and the high-potential-side voltage VCOMH. It is preferable that the amplitude of the gate voltages of the MOS transistors which form the third and fourth switch elements SW3 and SW4 be greater than the voltage difference between the system ground power supply voltage VSS (first power supply voltage) and the low-potential-side voltage VCOML. This enables the impedance to be further decreased when each MOS transistor is turned on, whereby the boost efficiency of the charge-pump operation can be improved.

In the case where the power supply circuit including the common voltage generation circuit in this embodiment includes the scan voltage generation circuit as shown in FIG. 4, the impedance of the transistor can be further decreased by setting the amplitude of the gate voltages of the MOS transistors which form the first to fourth switch elements SW1 to SW4 to be the same as the amplitude of the scan voltage applied to the scan line. This enables the boost efficiency of the charge-pump operation to be further improved.

Figure 26:
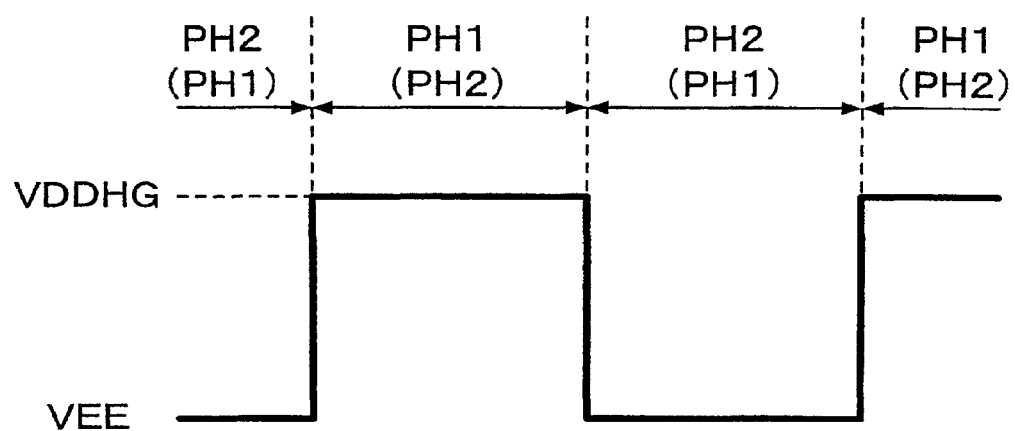
FIG. 26 shows an example of gate voltages of MOS transistors which form first to fourth switch elements.

In this case, a gate voltage shown in FIG. 26 is supplied to the MOS transistors which form the first to fourth switch elements SW1 to SW4.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention. For example, the present invention may be applied not only to drive the above-described liquid crystal display panel, but also to drive an electroluminescent device or plasma display device.

Part of requirements of any claim of the present invention could be omitted from a dependent claim which depends on that claim. Moreover, part of requirements of any independent claim of the present invention could be made to depend on any other independent claim.

What is claimed is:

1. A common voltage generation circuit for generating a common voltage applied to a common electrode that faces a pixel electrode specified by a scan line and a data line of an electro-optical device through an electro-optical substance, the common voltage generation circuit comprising:
    a first operational amplifier that outputs an amplitude voltage of the common voltage based on a first power supply voltage;
    a second operational amplifier that outputs a high-potential-side voltage of the common voltage based on the first power supply voltage; and
    a low-potential-side voltage generation circuit that generates a low-potential-side voltage of the common voltage by a charge-pump operation that causes the high-potential-side voltage to be supplied to one end of a flying capacitor, wherein a voltage difference between the first power supply voltage and the amplitude voltage is directly stored in the flying capacitor, the low-potential-side voltage being lower in potential than the high-potential-side voltage for the amplitude voltage,
    the common voltage generation circuit supplying the high-potential-side voltage or the low-potential-side voltage to the common electrode.

2. The common voltage generation circuit as defined in claim 1,
    the low-potential-side voltage generation circuit including:
    first and second switch elements connected in series; and
    third and fourth switch elements connected in series,
    the amplitude voltage being supplied to one end of the first switch element,
    the high-potential-side voltage being supplied to one end of the second switch element,
    the first power supply voltage being supplied to one end of the third switch element,
    the first power supply voltage being supplied to one end of the backup capacitor,
    in a first period, the first switch element being turned on and the second switch element being turned off to supply the amplitude voltage to one end of a flying capacitor, and the third switch element being turned on and the fourth switch element being turned off, and
    in a second period subsequent to the first period, the first switch element being turned off and the second switch element being turned on to supply the high-potential-side voltage to one end of the flying capacitor, and the third switch element being turned off and the fourth switch element being turned on to supply a voltage of the other end of the flying capacitor to the other end of the backup capacitor.

3. The common voltage generation circuit as defined in claim 2,
    the first and second switch elements being MOS transistors, amplitude of gate voltages of the MOS transistors that form the first and second switch elements being greater than a voltage difference between the amplitude voltage and the high-potential-side voltage, and
    the third and fourth switch elements being MOS transistors, amplitude of gate voltages of the MOS transistors that form the third and fourth switch elements being greater than a voltage difference between the first power supply voltage and the low-potential-side voltage.

4. The common voltage generation circuit as defined in claim 3,
    the amplitude of the gate voltages of the MOS transistors that form the first to fourth switch elements being the same as amplitude of a scan voltage applied to the scan line.

5. The common voltage generation circuit as defined in claim 1,
    the second operational amplifier being a voltage-follower-connected operational amplifier, output of the second operational amplifier being driven by an n-channel driver transistor, and
    the amplitude voltage being a potential higher than the high-potential-side voltage.

6. The common voltage generation circuit as defined in claim 5,
    the second operational amplifier including a second differential section and a second driver section that are voltage-follower-connected, and
    the second driver section including:
    a current source that is connected with a second power supply voltage at one end and is connected with the output of the second operational amplifier at the other end; and
    an n-channel driver transistor that is connected with the first power supply voltage at one end and is connected with the output of the second operational amplifier at the other end.

7. The common voltage generation circuit as defined in claim 6, the first operational amplifier being a voltage-follower-connected operational amplifier, output of the first operational amplifier being driven by a p-channel driver transistor.

8. The common voltage generation circuit as defined in claim 7,
the first operational amplifier including a first differential section and a first driver section that are voltage-follower-connected, and
the first driver section including:
a p-channel driver transistor that is connected with the second power supply voltage at one end and is connected with the output of the first operational amplifier at the other end; and
a current source that is connected with the first power supply voltage at one end and is connected with the output of the first operational amplifier at the other end.

9. The common voltage generation circuit as defined in claim 1,
the first operational amplifier being a voltage-follower-connected operational amplifier, output of the first operational amplifier being driven by a p-channel driver transistor.

10. The common voltage generation circuit as defined in claim 9,
the first operational amplifier including a first differential section and a first driver section that are voltage-follower-connected, and
the first driver section including:
a p-channel driver transistor that is connected with a second power supply voltage at one end and is connected with the output of the first operational amplifier at the other end; and
a current source that is connected with the first power supply voltage at one end and is connected with the output of the first operational amplifier at the other end.

11. The common voltage generation circuit as defined in claim 1, comprising:
a first output transistor to which the high-potential-side voltage is supplied at one end; and
a second output transistor to which the low-potential-side voltage is supplied at one end,
the other end of the first output transistor being connected with the other end of the second output transistor, and
amplitude of gate voltages of the first and second output transistors being greater than a voltage difference between the high-potential-side voltage and the low-potential-side voltage.

12. The common voltage generation circuit as defined in claim 11,
the amplitude of the gate voltages of the first and second output transistors being the same as amplitude of a scan voltage applied to the scan line.

13. A power supply circuit that includes the common voltage generation circuit defined in claim 1.

14. A display driver for driving an electro-optical device including a plurality of scan lines and a plurality of data lines, the display driver comprising:
the power supply circuit as defined in claim 13; and
a data line driver circuit that drives the data line based on display data.

15. A power supply circuit for providing a power supply to an electro-optical device including a plurality of scan lines and a plurality of data lines, the power supply circuit comprising:
the common voltage generation circuit as defined in claim 1; and
a scan voltage generation circuit that generates a scan voltage of the scan line and supplies a high-potential-side voltage and a low-potential-side voltage of the scan voltage to the common voltage generation circuit.

16. A display driver for driving an electro-optical device including a plurality of scan lines and a plurality of data lines, the display driver comprising:
the power supply circuit as defined in claim 15; and
a scan line driver circuit that drives the scan line by using the scan voltage.

17. The display driver as defined in claim 16, comprising:
a data line driver circuit that drives the data line based on display data.

18. A display device, comprising the common voltage generation circuit as defined in claim 1, and performing a liquid crystal display by using the common voltage generated by the common voltage generation circuit.

19. A common voltage generation method for generating a common voltage applied to a common electrode that faces a pixel electrode specified by a scan line and a data line of an electro-optical device through an electro-optical substance, the common voltage generation method comprising:
outputting an amplitude voltage of the common voltage based on a first power supply voltage by using a p-channel driver transistor of a voltage-follower-connected first operational amplifier, and generating a high-potential-side voltage of the common voltage based on the first power supply voltage by using an n-channel driver transistor of a voltage-follower-connected second operational amplifier;
generating a low-potential-side voltage of the common voltage by a charge-pump operation by using a flying capacitor connected between output of the first operational amplifier and the first power supply voltage, directly storing a voltage difference between the first power supply voltage and the amplitude voltage in the flying capacitor, the low-potential-side voltage being lower in potential than the high-potential-side voltage for the amplitude voltage; and
supplying the high-potential-side voltage or the low-potential-side voltage to the common electrode.

* * * * *